(12) United States Patent
Yoshimura et al.

(10) Patent No.: US 8,928,005 B2
(45) Date of Patent: Jan. 6, 2015

(54) LIGHT-EMITTING DEVICE

(75) Inventors: Kenichi Yoshimura, Osaka (JP); Kohsei Takahashi, Osaka (JP); Hiroshi Fukunaga, Osaka (JP); Naoto Hirosaki, Tsukuba (JP)

(73) Assignees: Sharp Kabushiki Kaisha, Osaka-shi (JP); Independent Administrative Institution, National Institute for Materials Science, Tsukuba-shi (JP)

( * ) Notice: Subject to any disclaimer, the term of this patent is extended or adjusted under 35 U.S.C. 154(b) by 279 days.

(21) Appl. No.: 13/381,348

(22) PCT Filed: Jul. 2, 2010

(86) PCT No.: PCT/JP2010/061345
§ 371 (c)(1),
(2), (4) Date: Dec. 28, 2011

(87) PCT Pub. No.: WO2011/002087
PCT Pub. Date: Jan. 6, 2011

(65) Prior Publication Data
US 2012/0104448 A1 May 3, 2012

(30) Foreign Application Priority Data

Jul. 2, 2009 (JP) .................................. 2009-157930
Feb. 3, 2010 (JP) .................................. 2010-022512

(51) Int. Cl.
*H01L 33/00* (2010.01)

(52) U.S. Cl.
USPC ..................................... 257/79; 257/E33.001

(58) Field of Classification Search
USPC .......................................... 257/79, E33.001
See application file for complete search history.

(56) References Cited

U.S. PATENT DOCUMENTS

| 8,038,905 B2 | 10/2011 | Mueller-Mach et al. |
| 2004/0135504 A1 | 7/2004 | Tamaki et al. |
| 2006/0038477 A1 | 2/2006 | Tamaki et al. |
| 2006/0091790 A1 | 5/2006 | Nagatomi et al. |
| 2007/0007494 A1 | 1/2007 | Hirosaki et al. |
| 2007/0108896 A1 | 5/2007 | Hirosaki |

(Continued)

FOREIGN PATENT DOCUMENTS

| JP | 2003-321675 | 11/2003 |
| JP | 2005-255895 | 9/2005 |

(Continued)

OTHER PUBLICATIONS

International Search Report mailed Oct. 25, 2011, directed to International Application No. PCT/JP2011/066226; 1 page.

(Continued)

*Primary Examiner* — Matthew Reames
(74) *Attorney, Agent, or Firm* — Morrison & Foerster LLP

(57) ABSTRACT

A semiconductor light-emitting device that is high in luminous efficiency and that emits light which is high in color rendering property includes a semiconductor light-emitting element that emits blue light; a green fluorescent substance that absorbs the blue light and emits green light; and an orange fluorescent substance that absorbs the blue light and emits orange light, fluorescence emitted by the green fluorescent substance and the orange fluorescent substance having an emission spectrum that has a peak wavelength of not less than 540 nm and not more than 565 nm and that satisfies the relation of 0.70>PI(90)/PI(MAX)>0.55, where PI(MAX) represents an emission intensity at the peak wavelength, and PI(90) represents an emission intensity at a wavelength 90 nm longer than the peak wavelength.

10 Claims, 19 Drawing Sheets

(56) References Cited

U.S. PATENT DOCUMENTS

| | | |
|---|---|---|
| 2007/0194695 A1 | 8/2007 | Yoon et al. |
| 2008/0089825 A1 | 4/2008 | Tamaki et al. |
| 2008/0128735 A1 | 6/2008 | Yoo et al. |
| 2008/0197321 A1 | 8/2008 | Hirosaki et al. |
| 2008/0258602 A1 | 10/2008 | Masuda et al. |
| 2008/0297031 A1 | 12/2008 | Takahashi et al. |
| 2009/0033201 A1 | 2/2009 | Shimooka et al. |
| 2009/0057707 A1 | 3/2009 | Katsuno et al. |
| 2009/0066230 A1 | 3/2009 | Hirosaki et al. |
| 2009/0072708 A1 | 3/2009 | Tamaki et al. |
| 2009/0079327 A1 | 3/2009 | Daicho et al. |
| 2009/0129052 A1 | 5/2009 | Hirosaki |
| 2009/0153028 A1 | 6/2009 | Hirosaki |
| 2009/0166584 A1 | 7/2009 | Shimooka et al. |
| 2009/0230840 A1 | 9/2009 | Tamaki et al. |
| 2009/0284132 A1 | 11/2009 | Tamaki et al. |
| 2009/0309485 A1 | 12/2009 | Tamaki et al. |
| 2010/0038590 A1 | 2/2010 | Suzuki et al. |
| 2010/0053932 A1 | 3/2010 | Emoto et al. |
| 2010/0085728 A1 | 4/2010 | Seto et al. |
| 2010/0133563 A1 | 6/2010 | Schmidt et al. |
| 2010/0283381 A1 | 11/2010 | Takahashi et al. |
| 2011/0007228 A1 | 1/2011 | Yoon et al. |
| 2011/0248303 A1 | 10/2011 | Suzuki et al. |
| 2012/0019127 A1 | 1/2012 | Hirosaki |
| 2012/0262648 A1 | 10/2012 | Hirosaki et al. |
| 2012/0319155 A1 | 12/2012 | Yoshimura et al. |
| 2013/0207146 A1 | 8/2013 | Yoshimura et al. |
| 2013/0328478 A1 | 12/2013 | Emoto |

FOREIGN PATENT DOCUMENTS

| | | |
|---|---|---|
| JP | 2006-8721 | 1/2006 |
| JP | 2006-206729 | 8/2006 |
| JP | 2007-134606 | 5/2007 |
| JP | 2007-180483 | 7/2007 |
| JP | 2007-227928 | 9/2007 |
| JP | 2007-231245 | 9/2007 |
| JP | 2008-127509 | 6/2008 |
| JP | 2008-127529 | 6/2008 |
| JP | 2008-127547 | 6/2008 |
| JP | 2008-138156 | 6/2008 |
| JP | 2008-147190 | 6/2008 |
| JP | 2008-530334 | 8/2008 |
| JP | 2008-244468 | 10/2008 |
| JP | 2008-244469 | 10/2008 |
| JP | 2008-250254 | 10/2008 |
| JP | 2008-303331 | 12/2008 |
| JP | 2009-49267 | 3/2009 |
| JP | 2009-73914 | 4/2009 |
| JP | 3150457 U | 4/2009 |
| WO | WO-2006/126567 | 11/2006 |
| WO | WO-2008/062781 | 5/2008 |
| WO | WO-2010/018999 | 2/2010 |
| WO | WO-2010/110457 | 9/2010 |

OTHER PUBLICATIONS

International Search Report mailed Oct. 25, 2011, directed to International Application No. PCT/JP2011/066230; 1 page.

U.S. Appl. No. 13/580,791, filed Aug. 23, 2012.

Xie, R-J. et al. (2007). "Silicon-based Oxynitride and Nitride Phosphors for White LEDs-A review." *Science and Technology of Advanced Materials.* 8:588-600.

International Search Report mailed Aug. 3, 2010, directed to International Patent Application No. PCT/JP2010/061345; 5 pages.

Yoshimura et al., U.S. Office Action mailed May 30, 2013, directed to U.S. Appl. No. 13/580,791; 9 pages.

Yoshimura et al., Notice of Allowance dated Oct. 10, 2013, directed to U.S. Appl. No. 13/580,791; 12 pages.

Search Report dated Mar. 1, 2011, directed to International Application No. PCT/JP2011/051600; 2 pages.

Yoshimura et al., U.S. Office Action mailed May 7, 2014, directed to U.S. Appl. No. 13/811,933; 7 pages.

Yoshima et al., U.S. Office Action mailed Jul. 24, 2014, directed to U.S. Appl. No. 13/811,996; 13 pages.

Yoshimura et al., U.S. Office Action mailed Nov. 7, 2014, directed to U.S. Appl. No. 13/811,996; 19 pages.

F I G. 1
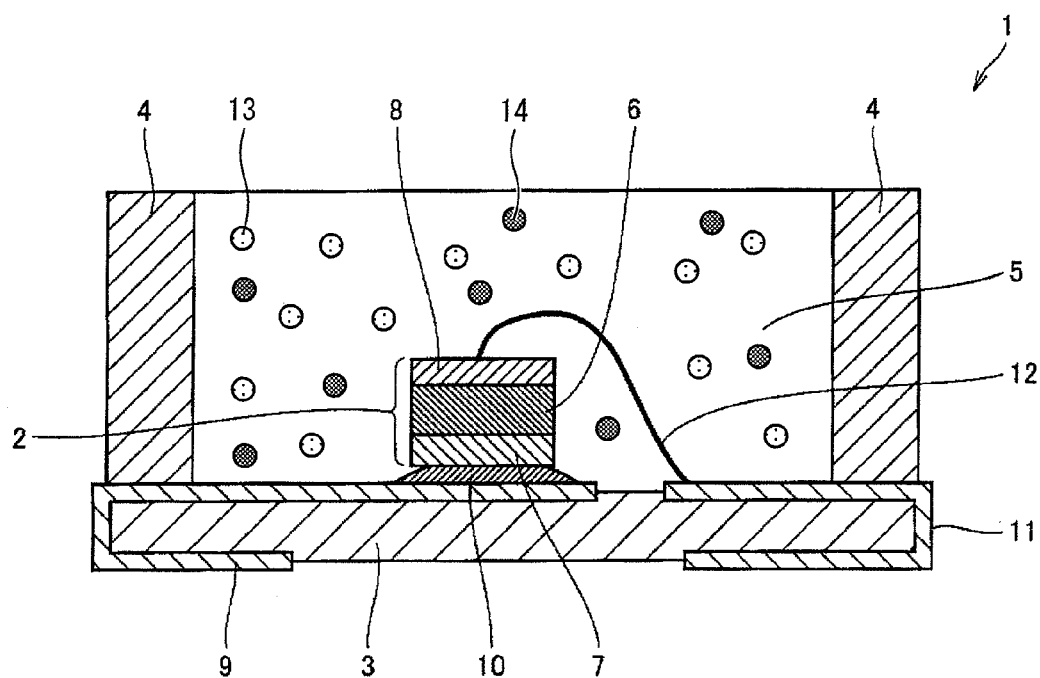
F I G. 2
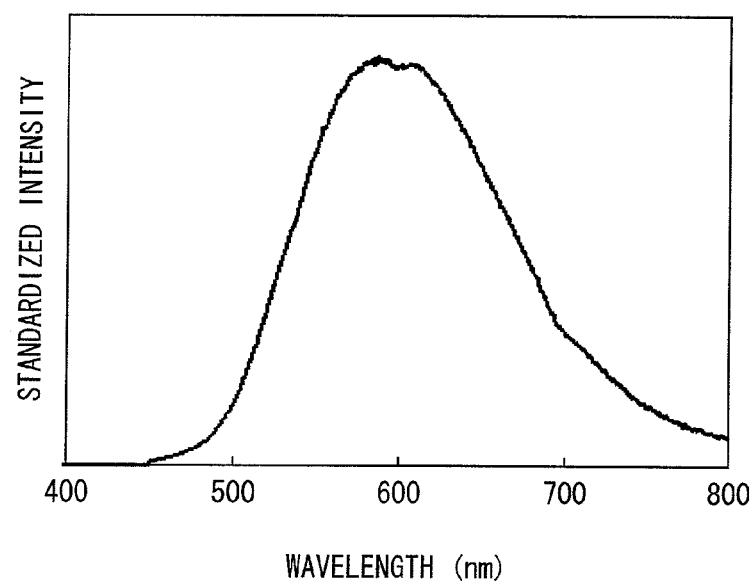

F I G. 9
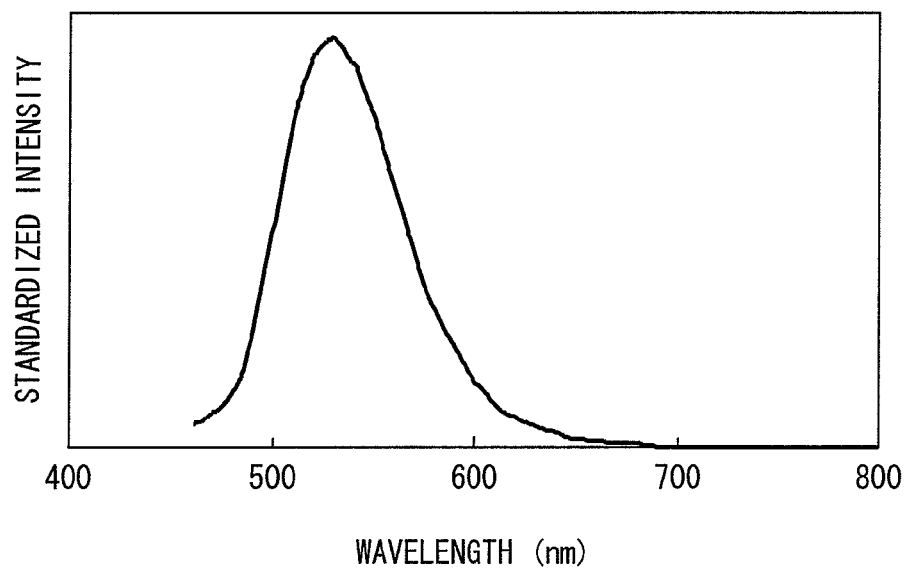
F I G. 10
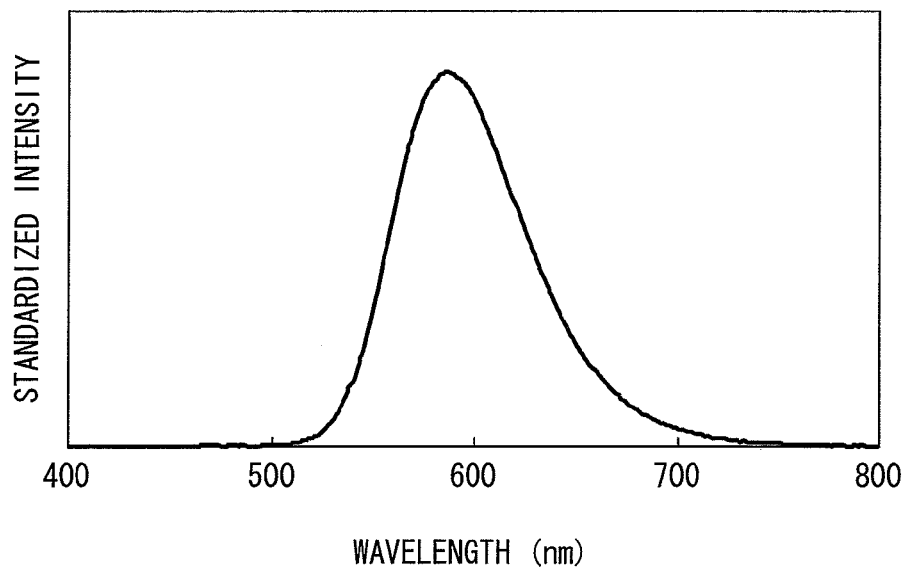

F I G. 1 1
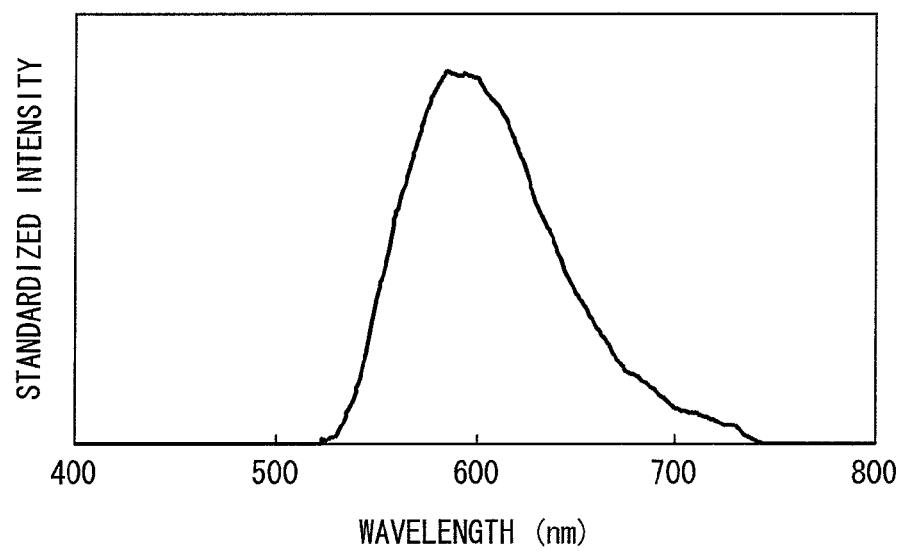
F I G. 1 2
EXAMPLE 1
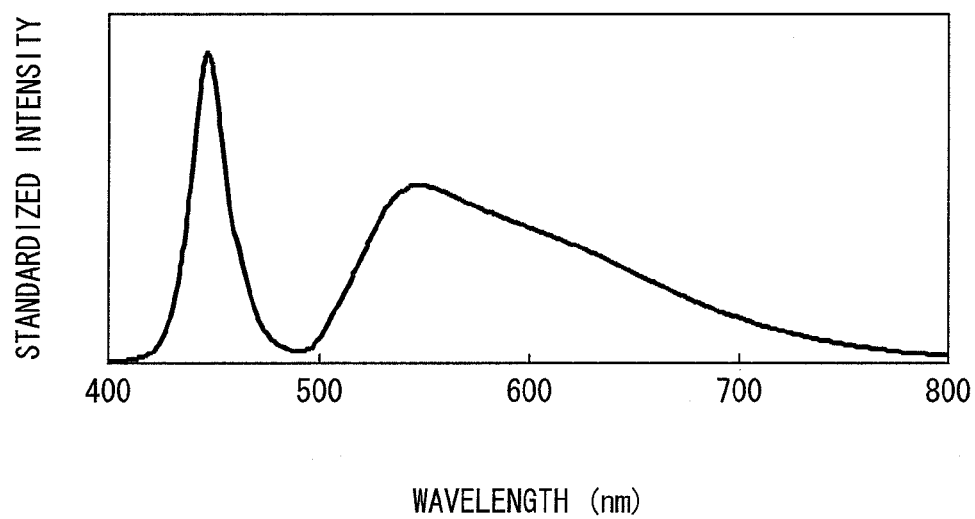

EXAMPLE 2

EXAMPLE 3

EXAMPLE 4

EXAMPLE 5

EXAMPLE 8

COMPARATIVE EXAMPLE 1

F I G. 2 5
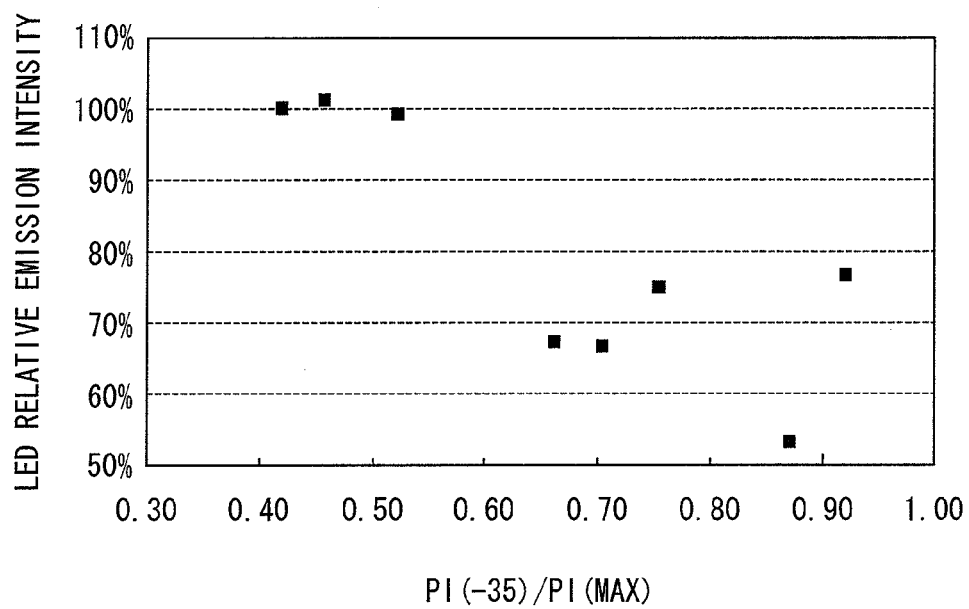
F I G. 2 6
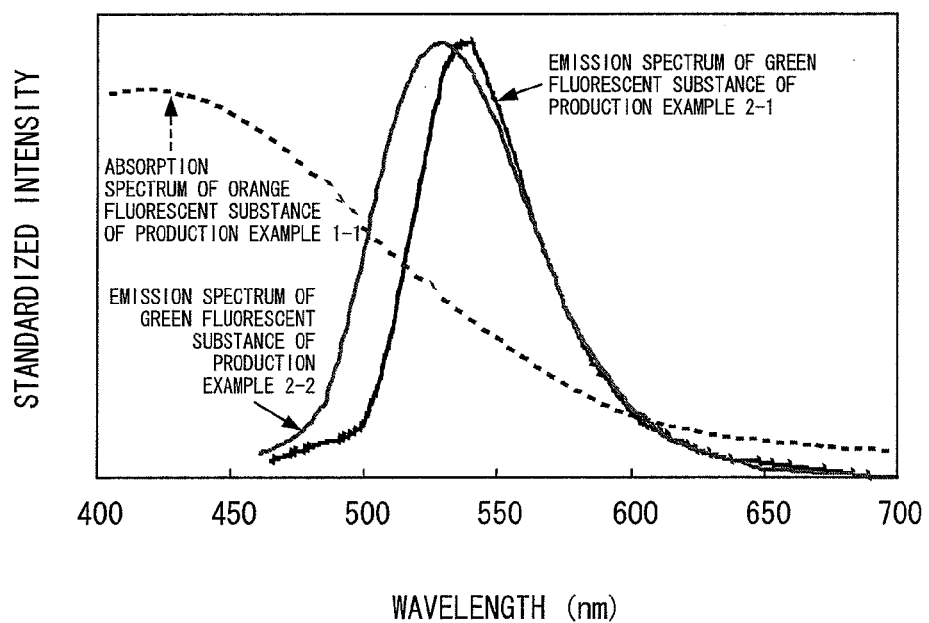

F I G. 2 7
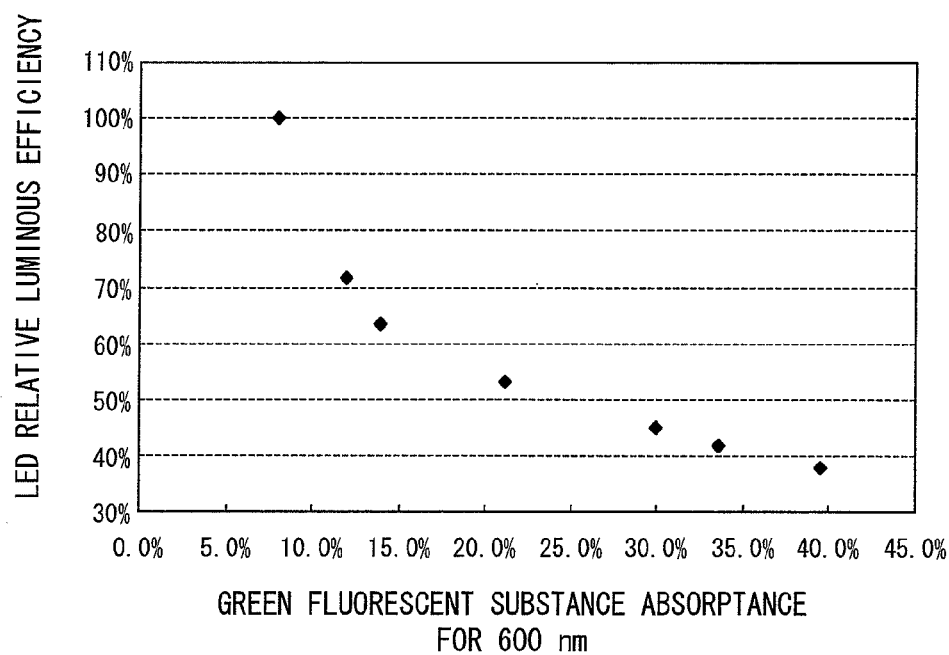
F I G. 2 8
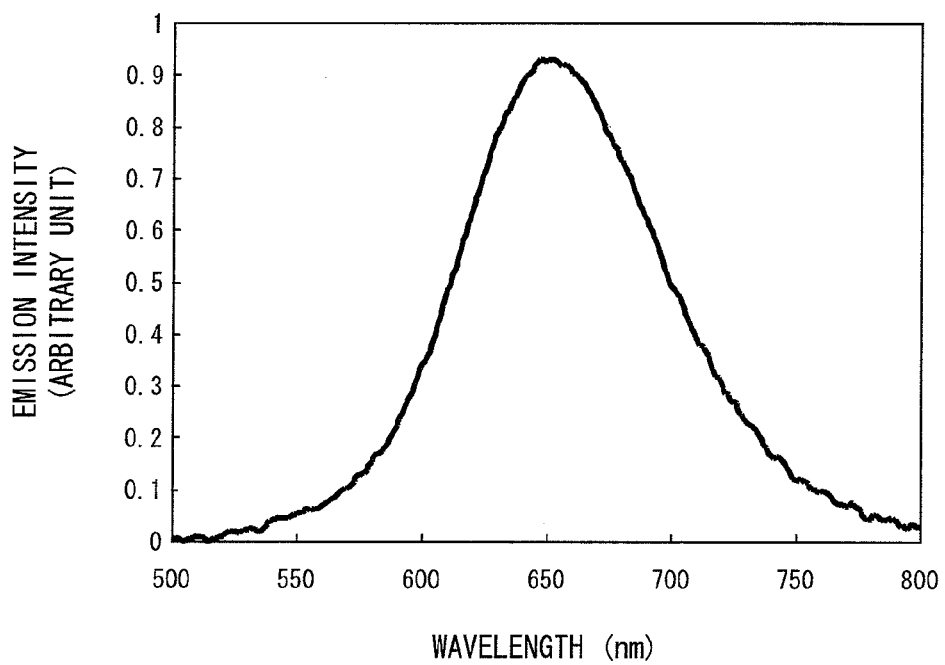

F I G. 3 1
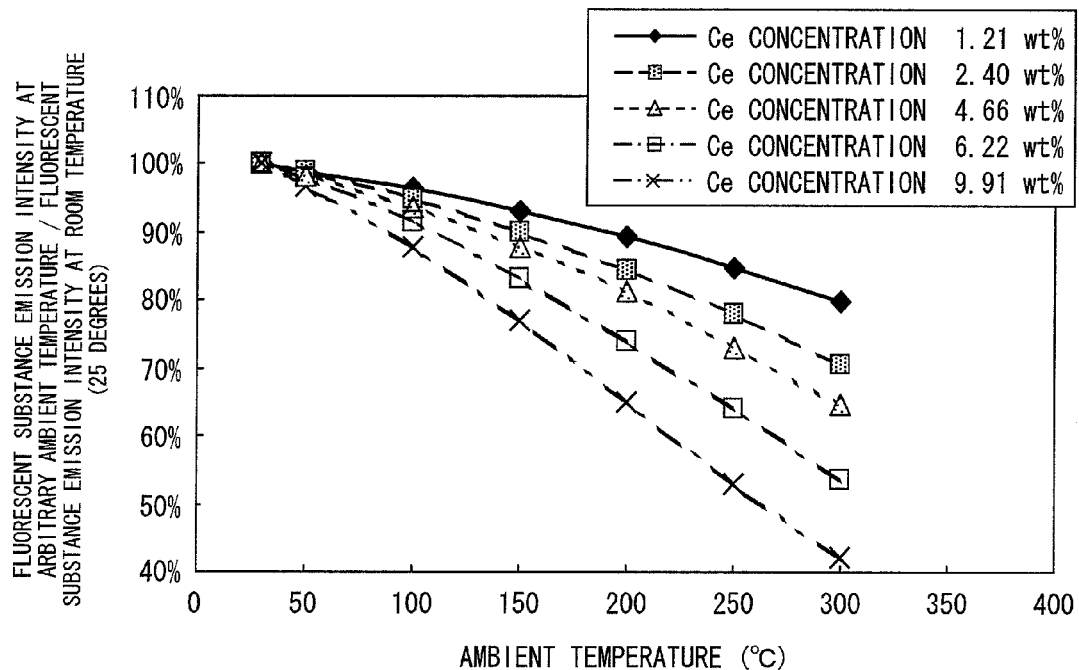
F I G. 3 2
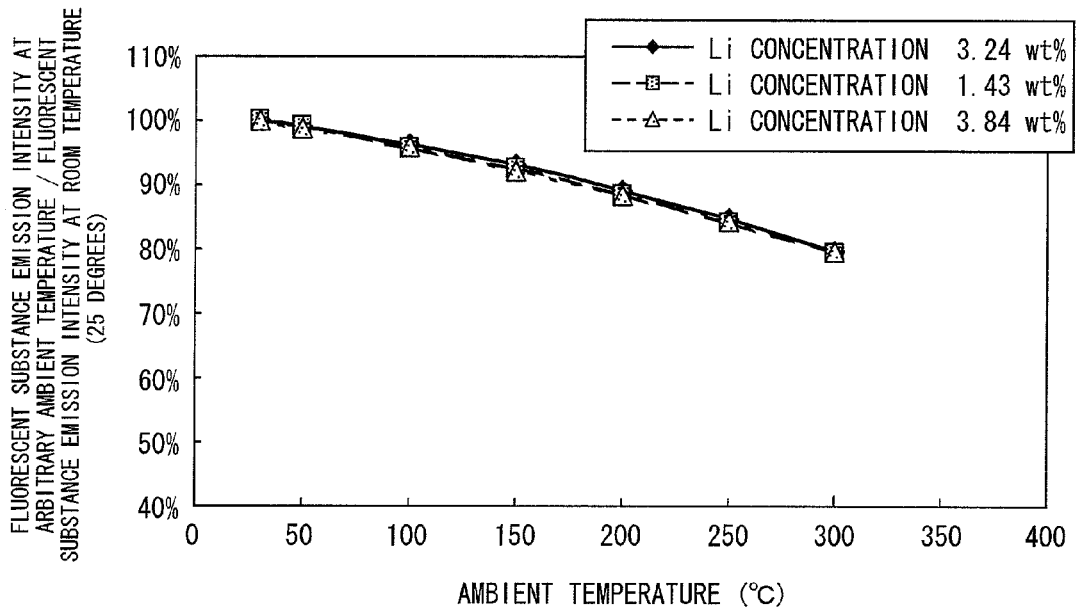

F I G. 3 3
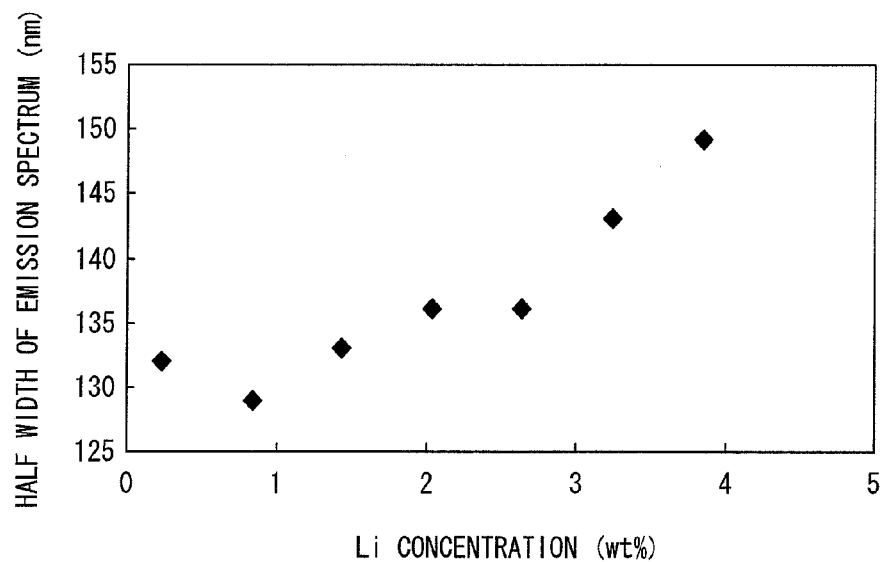
F I G. 3 4
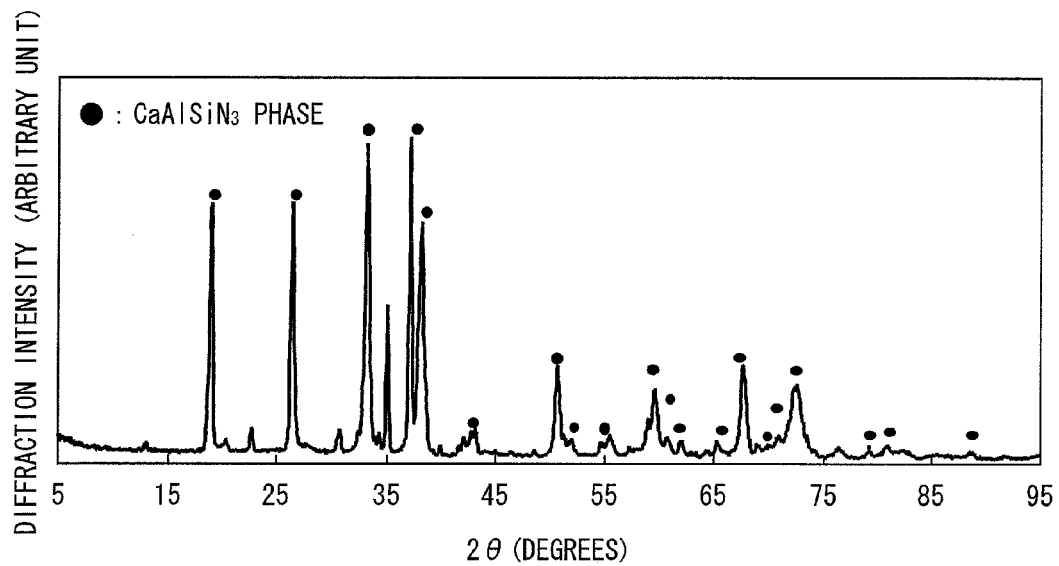

F I G. 3 5
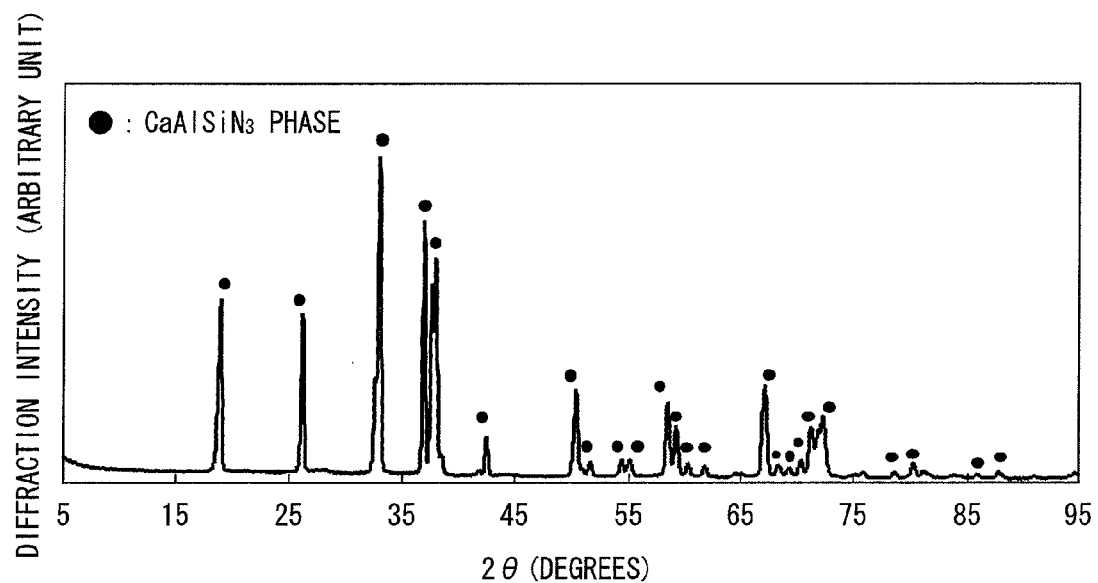
F I G. 3 6
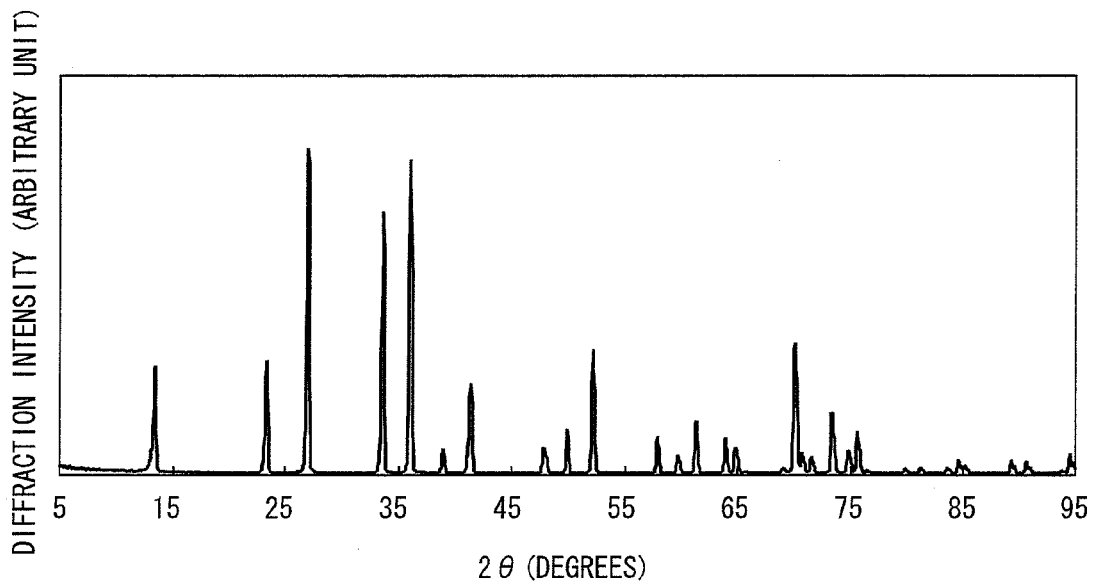

F I G. 3 7
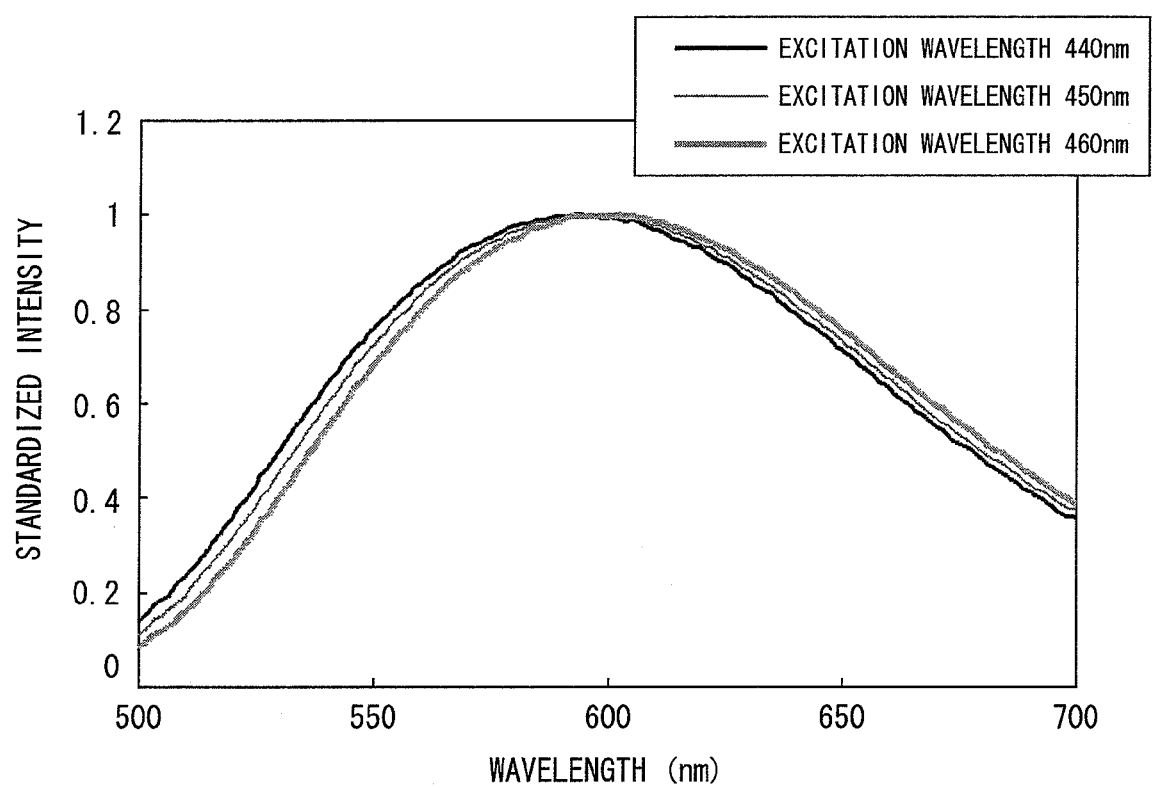

LIGHT-EMITTING DEVICE

REFERENCE TO RELATED APPLICATIONS

This application is the national stage under 35 USC 371 of International Application No. PCT/JP2010/061345, filed Jul. 2, 2010, which claims the priority of Japanese Patent Application Nos. 2009-157930 and 2010-022512, filed Jul. 2, 2009, and Feb. 3, 2010, respectively, the entire contents of which are incorporated herein by reference.

TECHNICAL FIELD

The present invention relates to a light-emitting device including fluorescent substances and a semiconductor light-emitting element.

BACKGROUND ART

A semiconductor light-emitting element such as a light-emitting diode (LED) is advantageously compact and low in power consumption, and is capable of stably emitting high-luminance light. Recent years have thus witnessed a continuing trend of replacing an illumination instrument such as an incandescent lamp by an illumination instrument including a light-emitting device that includes an LED and that emits white light. An example of an LED that emits white light combines a blue LED with a YAG fluorescent substance represented by the composition formula $(Y,Gd)_3(Al,Ga)_5O_{12}$.

A light-emitting device with the above arrangement emits white light through color mixture of (i) the blue light of the LED and (ii) yellow light emitted by the YAG fluorescent substance as a fluorescent substance. Such a light-emitting device with the above arrangement, however, emits light that is deficient in a red component due to a light emission property of the YAG fluorescent substance. This light-emitting device, when included in a household illumination instrument or the like, has a disadvantage of, for example, causing human skins to look unnatural in color.

Specifically, the above light-emitting device has a general color rendering index (Ra) of approximately 70 and, in particular, has a special color rendering index (R9; indicative of how the color red looks) of approximately −40 within a color temperature region defined by, for example, natural white and warm white for an illumination instrument. The light-emitting device, when included in an illumination instrument, emits light including a red component that looks extremely poor. Ra is an index that indicates how faithfully test light reproduces a test color with reference to a color that is seen with use of reference light and that has an index of 100. R9, in particular, is a special color rendering index for red.

Further, recent years have seen proposed a combination of (i) the above blue LED, a yellow fluorescent substance such as a YAG fluorescent substance, and a green fluorescent substance with (ii) a red fluorescent substance such as a nitride fluorescent substance. Such a combination increases uniformity in emission spectrum of fluorescence emitted by the fluorescent substances, and thus improves Ra and R9 of white light emitted by the semiconductor light-emitting device.

The above combination, however, uses red light within a long wavelength range, and thus increases the amount of energy within a wavelength region away from the luminosity curve for humans. In addition, the red fluorescent substance absorbs yellow light emitted by the yellow fluorescent substance, and thus significantly decreases luminous efficiency of the light-emitting device.

In view of such circumstances, there has been reported a white-light-emitting device that combines a blue LED, a green fluorescent substance, and an orange fluorescent substance (see, for example, Patent Literature 1).

The above light-emitting device, which combines a blue LED with two or more types of fluorescent substances, is high in Ra and R9 as compared to a light-emitting device that combines only a blue LED and a yellow fluorescent substance.

The light-emitting device of Patent Literature 1 combines a green fluorescent substance and an orange fluorescent substance, and thus has an emission spectrum that matches the spectral luminous efficacy for humans. This light-emitting device is consequently high in luminous efficiency as compared to a light-emitting device that combines a blue LED and a yellow fluorescent substance with a red fluorescent substance.

CITATION LIST

Patent Literature 1

Japanese Patent Application Publication, Tokukai, No. 2007-227928 A (Publication Date: Sep. 6, 2007)

SUMMARY OF INVENTION

The light-emitting device of Patent Literature 1, however, emits light that is deficient in a red component in the emission spectrum of the light-emitting device, and thus the index for red is not sufficient in value among the color rendering indexes. Further, the fluorescent substances emit light having a peak wavelength that is greatly away from the luminosity curve for humans, and are thus not sufficient in luminous efficiency.

The present invention has been accomplished in view of the above problem. It is an object of the present invention to provide a light-emitting device that is high in luminous efficiency and that emits light which is high in color rendering property.

To provide a light-emitting device that, as described above, emits light having a high color rendering property and that is high in luminous efficiency, the inventors of the present invention repeatedly prototyped light-emitting devices each including a fluorescent substance or a combination of a fluorescent substance and a semiconductor light-emitting element, and have consequently found that the combination described below makes it possible to provide a light-emitting device that solves the above problem. The inventors have thus completed the present invention, which is described below in detail.

In order to solve the above problem, a light-emitting device of the present invention includes: a semiconductor light-emitting element that emits blue light; a green fluorescent substance that absorbs the blue light and emits green light; and an orange fluorescent substance that absorbs the blue light and emits orange light, fluorescence emitted by the green fluorescent substance and the orange fluorescent substance having an emission spectrum that (i) has a peak wavelength of not less than 540 nm and not more than 565 nm and that (ii) satisfies a relation of $$0.70 > PI(90)/PI(MAX) > 0.55,$$

where PI(MAX) represents an emission intensity at the peak wavelength, and PI(90) represents an emission intensity at a wavelength 90 nm longer than the peak wavelength.

According to the above arrangement, the emission spectrum of the fluorescence has a peak wavelength that is very close to 555 nm, at which the spectral luminous efficacy for humans is peaked. This arrangement allows the light-emitting device to have a high luminous efficiency. The emission spectrum further satisfies PI(90)/PI(MAX)>0.55 above, which allows the light-emitting device to have an emission spectrum that is distributed throughout the visible range. This arrangement improves the color rendering property of light emitted by the light-emitting device, and provides a good value for, in particularly, an indicator such as R9 which indicates how the color red looks. This in turn (i) allows the emission spectrum of the present invention to both suitably match a luminosity curve and be uniform, and (ii) makes it possible to produce a light-emitting device that is particularly excellent in color rendering property and high in luminous efficiency. Therefore, the above arrangement achieves the advantage of providing a light-emitting device that is high in luminous efficiency and that emits light which is high in color rendering property.

As described above, a light-emitting device of the present invention includes: a semiconductor light-emitting element that emits blue light; a green fluorescent substance that absorbs the blue light and emits green light; and an orange fluorescent substance that absorbs the blue light and emits orange light, fluorescence emitted by the green fluorescent substance and the orange fluorescent substance having an emission spectrum that (i) has a peak wavelength of not less than 540 nm and not more than 565 nm and that (ii) satisfies a relation of $$0.70 > PI(90)/PI(MAX) > 0.55,$$

where PI(MAX) represents an emission intensity at the peak wavelength, and PI(90) represents an emission intensity at a wavelength 90 nm longer than the peak wavelength.

This arrangement makes it possible to provide a light-emitting device that is high in luminous efficiency and that emits light which is high in color rendering property.

BRIEF DESCRIPTION OF DRAWINGS

FIG. 1 is a cross-sectional view schematically illustrating a configuration of a semiconductor device of the present embodiment.

FIG. 2 is a graph illustrating an emission spectrum of a fluorescent substance powder prepared in Production Example 1-1.

FIG. 9 is a graph illustrating an emission spectrum of a fluorescent substance powder prepared in Production Example 2-2.

FIG. 10 is a graph illustrating an emission spectrum of a fluorescent substance powder prepared in Comparative Production Example 1.

FIG. 11 is a graph illustrating an emission spectrum of a fluorescent substance powder prepared in Comparative Production Example 2.

FIG. 12 is a graph illustrating an emission spectrum of a light-emitting device prepared in Example 1.

FIG. 25 is a graph illustrating a relation between an LED emission intensity and PI(−35)/PI(MAX) of a semiconductor light-emitting device.

FIG. 26 is a graph in which are plotted an absorption spectrum of an orange fluorescent substance and an emission spectrum of a green fluorescent substance.

FIG. 27 is a graph illustrating a relation, observed in a semiconductor light-emitting device, between an LED emission intensity and an absorptance of a green fluorescent substance with respect to light having a wavelength of 600 nm.

FIG. 28 is a graph illustrating an emission spectrum of a fluorescent substance powder obtained in Comparative Production Example 3.

FIG. 31 is a graph illustrating dependence of an emission intensity on an ambient temperature for a solid solution crystal containing Ce and oxygen each in the form of a solid solution, the emission intensity being achieved by exciting the solid solution crystal by light having a wavelength of 450 nm.

FIG. 32 is a graph illustrating dependence of an emission intensity on an ambient temperature for a solid solution crystal containing Ce and oxygen each in the form of a solid solution, the emission intensity being achieved by exciting the solid solution crystal by light having a wavelength of 450 nm.

FIG. 33 is a graph illustrating dependence of the half width of an emission spectrum on a Li concentration, the emission intensity being achieved by exciting the solid solution crystal by light having a wavelength of 450 nm.

FIG. 34 is a graph illustrating the results of an XRD measurement of the fluorescent substance powder obtained in Production Example 1-1.

FIG. 35 is a graph illustrating the results of an XRD measurement of the fluorescent substance powder obtained in Production Example 1-2.

FIG. 36 is a graph illustrating the results of an XRD measurement of the fluorescent substance powder obtained in Production Example 2-1.

FIG. 37 is a graph illustrating how an emission spectrum of the fluorescent substance powder obtained in Production Example 1-1 varies according to a variation in excitation wavelength.

DETAILED DESCRIPTION OF THE INVENTION

Figure 3:
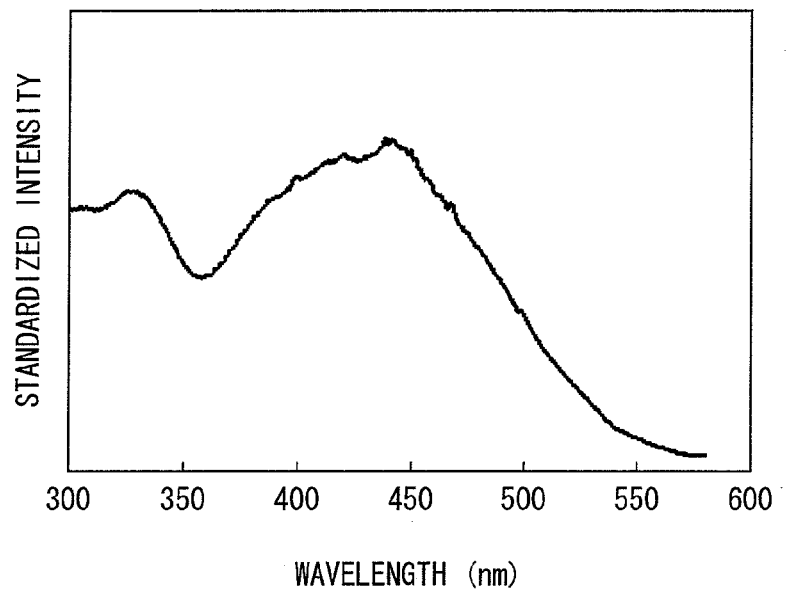
FIG. 3 is a graph illustrating an excitation spectrum of the fluorescent substance powder prepared in Production Example 1-1.

An embodiment of the present invention is described below. In the present specification, the range "A to B" intends to mean "not less than A but not more than B." Properties stated in the present specification are, unless otherwise specified, expressed by values measured in accordance with methods described in Examples below.

FIG. 1 is a cross-sectional view schematically illustrating a configuration of a semiconductor device of the present embodiment.

The semiconductor light-emitting device 1 of the present embodiment includes: a semiconductor light-emitting element 2 that emits blue light; an orange fluorescent substance 13 that absorbs the blue light and thus emits orange light; and a green fluorescent substance 14 that absorbs the blue light and thus emits green light.

The term "blue light" refers to light including, as a main component, light having a wavelength of 420 to 480 nm. The term "green light" refers to light including, as a main component, light having a wavelength of 500 to 550 nm. The term "orange light" refers to light including, as a main component, light having a wavelength of 560 to 620 nm. The term "red light" refers to light including, as a main component, light having a wavelength of 620 nm to 680 nm.

The term "green fluorescent substance" refers to a substance that is excited by the blue light to emit the green light. The term "orange fluorescent substance" refers to a substance that is excited by the blue light to emit the orange light.

The expression "including, as a main component" means containing something at a proportion of 50% or greater. More specifically, the expression means containing something at a proportion of 50% or greater in area ratio in an emission spectrum measured by a method described in Examples below.

The semiconductor light-emitting device 1 of the present embodiment includes: a printed wiring board 3 serving as a substrate; the semiconductor light-emitting element 2 and a resin frame 4 both placed on the printed wiring board 3; and a mold resin 5 that includes a light-transmitting resin in which are dispersed the orange fluorescent substance 13 and the green fluorescent substance 14 and that fills the inside of the resin frame 4 to contain the semiconductor light-emitting element 2.

The semiconductor light-emitting element 2 includes: an InGaN layer 6 serving as an active layer; and a p-side electrode 7 and an n-side electrode 8 sandwiching the InGaN layer 6. The n-side electrode 8 is electrically connected, via an electrically conductive adhesive 10, to an n electrode section 9 provided to extend from an upper surface of the printed wiring board 3 to its back surface. The p-side electrode 7 of the semiconductor light-emitting element 2 is electrically connected, via a metal wire 12, to a p electrode section 11 provided separately from the n electrode section 9 to extend from the upper surface of the printed wiring board 3 to its back surface.

The semiconductor light-emitting device 1 of the present embodiment is not limited in structure by FIG. 1, and can thus have a typical structure of a semiconductor light-emitting device which structure has been publicly known.

(I) Emission Spectrum

The green fluorescent substance 14 and the orange fluorescent substance 13 in the semiconductor light-emitting device 1 of the present embodiment emit fluorescence having an emission spectrum that has a peak wavelength within the range of 540 nm to 565 nm.

The above emission spectrum (hereinafter also referred to simply as "fluorescence spectrum of the fluorescence emitted by the fluorescent substances") of the fluorescence emitted by the green fluorescent substance 14 and the orange fluorescent substance 13 refers to a spectrum obtained by overlapping (i) a spectrum of orange light that the orange fluorescent substance 13 emits by absorbing blue light emitted by the semiconductor light-emitting element 2 and (ii) a spectrum of green light that the green fluorescent substance 14 emits by absorbing blue light emitted by the semiconductor light-emitting element 2.

Further, the fluorescence spectrum satisfies the following relation:

$$0.70 > PI(90)/PI(MAX) > 0.55,$$

where PI(MAX) represents an emission intensity at the peak wavelength of the fluorescence spectrum of the fluorescence emitted by the fluorescent substances, and PI(90) represents an emission intensity at a wavelength 90 nm longer than the peak wavelength.

The above emission spectrum having a peak wavelength within the above range has a high emission intensity in the vicinity of 555 nm, around which the spectral luminous efficacy for humans is highest. This arrangement makes it possible to produce a light-emitting device that is high in luminous efficiency.

Satisfying the relation $PI(90)/PI(MAX) > 0.55$ allows the emission spectrum to be distributed throughout the visible range, and thus improves the color rendering property. Further, satisfying the relation $0.70 > PI(90)/PI(MAX)$ reduces emission intensity within the red range, within which the spectral luminous efficacy for humans is low, and thus both maintains the luminous efficiency of the light-emitting device and achieves a high color rendering property.

In the semiconductor light-emitting device 1 of the present embodiment, the fluorescence spectrum preferably further satisfies the following relation:

$$PI(-35)/PI(MAX) < 0.60,$$

where PI(−35) represents an emission intensity at a wavelength 35 nm shorter than the peak wavelength.

Satisfying the above relation further increases the intensity in the vicinity of 555 nm, around which the spectral luminous efficacy for humans is peaked, and thus makes it possible to produce a light-emitting device that is higher in luminous efficiency.

In the case where a light-emitting device is constituted by a combination of a semiconductor light-emitting element and various fluorescent substances, such a light-emitting device is usually designed to have an emission spectrum that is flat over a wavelength range in the vicinity of the visible range in order to improve the color rendering property.

However, in the present embodiment, which is more preferable, the fluorescence spectrum of the fluorescence emitted by the fluorescent substances satisfies PI(−35)/PI(MAX) <0.60 as described above. The fluorescence spectrum thus has an intensity that varies steeply at a valley area which is present between the blue range and the green range as illustrated in, for example, FIG. 12 referred to below.

This spectrum shape, which is in disagreement with conventional concepts of design of a light-emitting device, is a suitable spectrum shape found by the inventors of the present invention as a result of prototyping a light-emitting device with use of fluorescent substances and a semiconductor light-emitting element in order to provide a light-emitting device that is high in both color rendering property and luminous efficiency.

(II) Semiconductor Light-Emitting Element

The present embodiment uses a light-emitting diode (LED) as the semiconductor light-emitting element 2. The semiconductor light-emitting element 2 is, however, not limited to a light-emitting diode (LED), and can be any element, such as a semiconductor laser and an inorganic EL (electroluminescence) element, which emits blue light and which has been publicly known. The above LED can be, for example, a commercially available LED produced by a company such as Cree Inc.

The semiconductor light-emitting element 2 is not particularly limited in light emission peak wavelength. The light emission peak wavelength, however, more preferably falls within the range of 440 nm to 470 nm in order to further increase the respective values of Ra and R9.

(III) Orange Fluorescent Substance

The orange fluorescent substance 13 preferably has an emission spectrum that (i) has a peak wavelength which falls within the range of 570 nm to 620 nm and that (ii) has a half width of the peak within the range of 120 nm to 150 nm.

In the case where the emission spectrum has a peak wavelength and a half width of the peak within the above respective ranges, the fluorescence spectrum of the fluorescence emitted by the fluorescent substances can be set within the above range. This arrangement makes it possible to produce a semiconductor light-emitting device that is higher in luminous efficiency and color rendering property.

Further, the orange fluorescent substance 13 preferably has an absorptance that satisfies the following relation:

ABS(520)/ABS(MAX)<0.60, where ABS(MAX) represents a maximum value, within a range of wavelengths longer than 420 nm, of the absorptance of the orange fluorescent substance 13, and ABS(520) represents an absorptance (absorptivity) of the orange fluorescent substance 13 at a wavelength of 520 nm.

The orange fluorescent substance 13 having an absorptance that satisfies the above condition sufficiently reduces its absorption of green light, and thus makes it possible to produce a light-emitting device that is higher in luminous efficiency.

The orange fluorescent substance 13 preferably has an excitation spectrum that has an excitation peak within the range of 440 nm to 470 nm. The orange fluorescent substance 13 having an excitation spectrum that satisfies the above requirement makes it possible to produce a light-emitting device that is higher in luminous efficiency.

The orange fluorescent substance 13 is not particularly limited to any specific one as long as it has an emission spectrum having the above peak wavelength and half width. The orange fluorescent substance 13 is, however, preferably a Ce-activated fluorescent substance that is activated by Ce.

This is because Ce has two ground levels that split greatly and a Ce-activated fluorescent substance thus exhibits a wide emission spectrum.

Specifically, the above Ce-activated fluorescent substance is, suitably, a Ce-activated nitride fluorescent substance or a Ce-activated oxynitride fluorescent substance. A nitride fluorescent substance and an oxynitride fluorescent substance each have a host crystal that is higher covalency than, for example, an oxide fluorescent substance or a sulfide fluorescent substance, and thus have a highly stable host crystal and are not likely to suffer from a decrease in emission intensity even under a high-temperature environment.

The above orange fluorescent substance is preferably a fluorescent substance that contains Ce and a crystal phase and that has a chemical composition represented by the following General Formula (1):

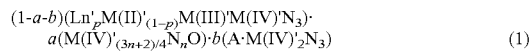

$$(1-a-b)(Ln'_pM(II)'_{(1-p)}M(III)'M(IV)'N_3) \cdot a(M(IV)'_{(3n+2)/4}N_nO) \cdot b(A \cdot M(IV)'_2N_3) \quad (1)$$

where: Ln' represents at least one metallic element selected from the group consisting of a lanthanoid, Mn, and Ti; M(II)' represents one element or two or more elements selected from the group consisting of bivalent metallic elements other than the Ln' element; M(III)' represents one element or two or more elements selected from the group consisting of trivalent metallic elements; M(IV)' represents one element or two or more elements selected from the group consisting of tetravalent metallic elements; A represents one or more monovalent metallic elements selected from the group consisting of Li, Na, and K; p represents a number that satisfies 0<p≤0.2; and a, b, and n represent numbers that satisfy 0≤a, 0≤b, a+b>0, 0≤n, and 0.002≤(3n+2)a/4≤0.9.

A compound having a composition represented by Formula (1) can be prepared by, for example, (i) mixing a nitride or oxide of each constituent metallic element at a ratio to achieve a desired composition ratio and (ii) firing the mixture.

A typical composition represented by Formula (1) can be exemplified by CaAlSiN$_3$, which is activated by Ce and emits orange light, and which can be prepared in accordance with a description of Japanese Patent Publication No. 3837588.

Other typical compositions can be exemplified by respective compositions represented by the following Formulae (2) and (3):

$$(1-a)(Ce_pCa_{1-p}AlSiN_3) \cdot aSi_2N_2O \quad (2)$$

$$(1-x)(Ce_y(Ca,Sr)_{1-y}AlSiN_3) \cdot xLiSi_2N_3 \quad (3),$$

and can be prepared in accordance with a description of Japanese Patent Application Publication No. 2007-231245 A.

In Formula (2) above, (i) p satisfies 0<p≤0.2 or more preferably satisfies 0.005<p≤0.1, and (ii) a satisfies 0≤a≤0.45, preferably satisfies 0≤a≤0.3, more preferably satisfies 0.002≤a≤0.3, or even more preferably satisfies 0.15≤a≤0.3.

In Formula (3) above, (i) y satisfies 0<y≤0.2 or preferably satisfies 0.003<y≤0.2, and (ii) x satisfies 0<x<1.0, preferably satisfies 0.02≤x≤0.4, or more preferably satisfies 0.03≤x≤0.35.

The Ce-activated fluorescent substance preferably includes a host crystal containing oxygen and Li in order to emit orange light. The host crystal may contain only either of oxygen and Li or both of oxygen and Li. The host crystal more preferably contains both of oxygen and Li. The Ce-activated fluorescent substance containing either or both of oxygen and oxygen has an emission spectrum, an absorptance, and an excitation spectrum that satisfy the above respective requirements. The Ce-activated CaAlSiN$_3$ fluorescent substance is consequently higher in luminous efficiency.

In particularly, in the case where the Ce-activated fluorescent substance is a solid solution crystal including a crystal that contains Ce and oxygen each in the form of a solid solution and that has the following composition:

$$cCaAlSiN_3 \cdot (1-c)LiSi_2N_3,$$

where $0.2 \leq c \leq 0.8$, the Ce-activated fluorescent substance is particularly high in luminous efficiency of orange light emission, and is thus more preferable as an orange fluorescent substance.

In order for the above Ce-activated fluorescent substance to be a solid solution crystal including a crystal that has the above composition and that contains Ce and oxygen each in the form of a solid solution, raw material powder needs to include at least one kind of an oxide of a constituent metallic element, for example, $CeO_2$.

The above solid solution crystal containing Ce and oxygen each in the form of a solid solution preferably has a Li concentration of not more than 4 weight % for a higher luminous efficiency.

In the case where a semiconductor light-emitting element is included in, for example, an illumination instrument, it is necessary to flow a large current as compared to the case where a semiconductor light-emitting element is used as, for example, an indicator. Such a large current causes an ambient temperature for the semiconductor light-emitting element to reach as high temperatures as 100° C. to 150° C. For example, Japanese Patent Application Publication, Tokukai, No. 2008-127529 A discloses that a YAG:Ce fluorescent substance exemplified in Japanese Patent Application Publication, Tokukai, No. 2003-321675 A has an emission intensity that is, under a high-temperature environment with an ambient temperature of 150° C., decreased by 50% from an emission intensity achieved at room temperature. In contrast to such a conventional fluorescent substance, the oxynitride fluorescent substance exemplified in the present specification is excellent in light emission property particularly under a high-temperature environment. As with a fluorescent substance exemplified in, for example, Non Patent Literature (Science and Technology of Advanced Materials 8 (2007) 588-600), the oxynitride fluorescent substance has an emission intensity that is, even under a high-temperature environment with an ambient temperature of 100° C. to 150° C., approximately 85% to 90% of an emission intensity achieved at room temperature.

The semiconductor light-emitting device of the present invention preferably includes fluorescent substances each equivalent in light emission property under a high-temperature environment to the fluorescent substance exemplified in the above Non Patent Literature. To this end, the above solid solution crystal containing Ce and oxygen each in the form of a solid solution preferably has a Ce concentration that is more than 0 weight % and not more than 6 weight %.

Further, the solid solution crystal containing Ce and oxygen each in the form of a solid solution preferably has a Li concentration that is not less than 1.5 weight % in order to increase the half width of the emission spectrum. The semiconductor light-emitting device of the present invention is higher in color rendering property with a larger half width of the emission spectrum of the orange fluorescent substance, and thus makes it possible to provide a light-emitting device that is high in luminous efficiency.

(IV) Green Fluorescent Substance

The green fluorescent substance 14 can suitably be a green fluorescent substance having an emission spectrum that has a narrow half width and that has a peak wavelength within the range of 520 nm to 545 nm.

In the case where the green fluorescent substance 14 has an emission spectrum that has a peak wavelength within the above range, the light-emitting device 1, which emits white light by combining the green fluorescent substance 14 with the orange fluorescent substance 13 and the semiconductor light-emitting element 2 emitting blue light, can have a fluorescence spectrum that has a peak wavelength within the range of 540 nm to 565 nm. This arrangement makes it possible to produce a light-emitting device that is high in luminous efficiency.

The green fluorescent substance 14 has an emission spectrum that preferably has a half width of not more than 55 nm or that particularly suitably has a half width of not less than 30 nm and not more than 55 nm.

In the case where the green fluorescent substance 14 has an emission spectrum that has a half width within the above range, this half width of the emission spectrum of the green fluorescent substance 14 is sufficiently narrower than the half width of the emission spectrum of the orange fluorescent substance 13. This arrangement reduces absorption of green light by the orange fluorescent substance 13, and thus makes it possible to produce a light-emitting device that is even higher in luminous efficiency.

The green fluorescent substance 14 described above is not particularly limited to any specific one, and is, for example, suitably a Eu-activated oxynitride fluorescent substance because it is highly stable and excellent in temperature characteristic. Further, (i) a Eu-activated BSON fluorescent substance disclosed in Japanese Patent Application Publication, Tokukai, No. 2008-138156 A and (ii) a Eu-activated β-sialon fluorescent substance disclosed in Japanese Patent Application Publication, Tokukai, No. 2005-255895 A are suitable among other Eu-activated oxynitride fluorescent substances because both of them are particularly excellent in luminous efficiency.

The above Eu-activated BSON fluorescent substance is, to be specific, preferably a fluorescent substance having the following composition:

$$Ba_{y'}Eu_{x'}Si_{u'}O_{v'}N_{w'},$$

where $0 \leq y' \leq 3$, $1.6 \leq y'+x' \leq 3$, $5 \leq u' \leq 7$, $9 < v' < 15$, and $0 < w' \leq 4$. The above y', x', u', v', and w' are more preferably defined in range as $1.5 \leq y' \leq 3$, $2 \leq y'+x'$ 3, $5.5 \leq u' \leq 7$, $10 < v' < 13$, and $1.5 < w' \leq 4$.

The above Eu-activated β-sialon fluorescent substance is, to be specific, preferably a fluorescent substance having the following composition:

$$Si_{6-z'}Al_{z'}O_{z'}N_{8-z'},$$

where $0 < z' < 4.2$. The above z' is more preferably defined in range as $0 < z' < 0.5$.

The Eu-activated β-sialon fluorescent substance, in particular, is excellent in stability and temperature characteristic, and has an emission spectrum that has a particularly narrow half width. The Eu-activated β-sialon fluorescent substance thus exhibits an excellent light emission property.

PCT International Publication WO2008/062781 discloses a Eu-activated β-sialon fluorescent substance from which a damaged phase of the fluorescent substance has been removed through an aftertreatment, such as an acid treatment, carried out after firing. This Eu-activated β-sialon fluorescent substance consequently has only a small unnecessary absorption and a high luminous efficiency.

The green fluorescent substance 14 is, to be more specific, suitably a green fluorescent substance having a light absorptance of not more than 10% at a wavelength of 600 nm, which falls within a wavelength range that makes no contribution to light emission of a β-sialon fluorescent substance and which falls in the vicinity of the peak wavelength of the orange fluorescent substance.

In the case where (i) the green fluorescent substance 14 of the present embodiment is a Eu-activated oxynitride fluorescent substance and (ii) the orange fluorescent substance 13 of the present embodiment is a Ce-activated nitride fluorescent substance or a Ce-activated oxynitride fluorescent substance, the two fluorescent substances are both nitride fluorescent substances, and are thus close to each other in value of, for example, temperature dependence, specific gravity, and particle size. This arrangement allows a semiconductor light-emitting element formed as above to be a light-emitting element that can be produced with a high yield and that is not affected by the environment and is thus highly reliable. In addition, a nitride fluorescent substance has a host crystal that is high in covalency, and is thus particularly low in temperature dependence and highly resistant to chemical and physical damages.

(V) Mold Resin

In the semiconductor light-emitting device 1, the mold resin 5 for serving to contain the semiconductor light-emitting element 2 includes, for example, (i) a light-transmitting resin such as a silicone resin and an epoxy resin and (ii) the orange fluorescent substance 13 and the green fluorescent substance 14 both dispersed in the light-transmitting resin. There is no particular limit to the method for the dispersion, and the method can thus be any method that has been publicly known.

There is no particular limit to the mixing ratio of the orange fluorescent substance 13 and the green fluorescent substance 14 to be dispersed. The mixing ratio can be determined as appropriate so that a spectrum is achieved that provides a desired white point.

For example, the light-transmitting resin can have a mass ratio (that is, the mass of the light-transmitting resin/[the orange fluorescent substance 13+the green fluorescent substance 14]) of 2 to 20 with respect to the orange fluorescent substance 13 and the green fluorescent substance 14. Further, the green fluorescent substance 14 can have a mass ratio (that is, the mass ratio of [the green fluorescent substance 14/the orange fluorescent substance 13]) of 0.2 to 2 with respect to the orange fluorescent substance 13.

(VI) Other

In the semiconductor light-emitting device of the present embodiment, members (such as the printed wiring board 3, the adhesive 10, and the metal wire 12) other than the semiconductor light-emitting element 2, the orange fluorescent substance 13, the green fluorescent substance 14, and the mold resin 5 can each be technically similar to a corresponding conventional member (see, for example, Japanese Patent Application Publication, Tokukai, No. 2003-321675 A and Japanese Patent Application Publication, Tokukai, No. 2006-8721 A), and can each be prepared by a method technically similar to a corresponding conventional method.

As described above, the light-emitting device of the present invention may preferably be arranged such that the emission spectrum of the fluorescence emitted by the green fluorescent substance and the orange fluorescent substance further satisfies a relation of

PI(−35)/PI(MAX)<0.60, where PI(−35) represents an emission intensity at a wavelength 35 nm shorter than the peak wavelength.

With the above arrangement, the emission spectrum satisfies the above relation of PI(−35)/PI(MAX)<0.60. This arrangement, in the case where light emitted by the light-emitting device has a chromaticity point set as a desired white point, increases the intensity for 555 nm, at which the spectral luminous efficacy for humans is peaked. This makes it possible to produce a light-emitting device that is higher in luminous efficiency.

The light-emitting device of the present invention may preferably be arranged such that the blue light emitted by the semiconductor light-emitting element has a peak wavelength of not less than 440 nm and not more than 470 nm; fluorescence emitted by the orange fluorescent substance has an emission spectrum that has a peak wavelength of not less than 570 nm and not more than 620 nm; and the emission spectrum of the fluorescence emitted by the orange fluorescent substance has a half width of not less than 120 nm and not more than 150 nm.

The above arrangement makes it possible to produce a light-emitting device that is higher in luminous efficiency and that emits light which is higher in color rendering property.

The light-emitting device of the present invention may preferably be arranged such that fluorescence emitted by the green fluorescent substance has an emission spectrum that has a peak wavelength of not less than 520 nm and not more than 545 nm.

The above arrangement further increases the intensity for 555 nm, at which the spectral luminous efficacy for humans is peaked, and thus makes it possible to produce a light-emitting device that is higher in luminous efficiency.

The light-emitting device of the present invention may preferably be arranged such that fluorescence emitted by the green fluorescent substance has an emission spectrum that has a half width of not more than 55 nm.

The light-emitting device of the present invention may preferably be arranged such that the orange fluorescent substance satisfies a relation of

ABS(520)/ABS(MAX)<0.60, where ABS(MAX) represents a maximum value of an absorptance of the orange fluorescent substance within a range of a wavelength longer than 420 nm, and ABS(520) represents a value of the absorptance of the orange fluorescent substance at a wavelength of 520 nm.

In the case where the orange fluorescent substance has an absorptance that satisfies the above relation, the orange fluorescent substance sufficiently reduces its absorption of green light, which in turn makes it possible to produce a light-emitting device that is high in luminous efficiency.

The light-emitting device of the present invention may preferably be arranged such that the orange fluorescent substance is a Ce-activated fluorescent substance.

The light-emitting device of the present invention may preferably be arranged such that the Ce-activated fluorescent substance is one of a Ce-activated nitride fluorescent substance and a Ce-activated oxynitride fluorescent substance.

The light-emitting device of the present invention may preferably be arranged such that the Ce-activated fluorescent substance contains a crystal phase having a chemical composition represented by General Formula (1) below, $(1-a-b)(Ln'_p M(II)'_{(1-p)} M(III)' M(IV)' N_3) \cdot a(M(IV)'_{(3n+2)/4} N_n O) \cdot b(A \cdot M(IV)'_2 N_3)$ (1), where:

Ln' represents at least one metallic element selected from the group consisting of a lanthanoid, Mn, and Ti; M(II)' represents one element or two or more elements selected from the group consisting of a bivalent metallic element other than the Ln' element; M(III)' represents one element or two or more elements selected from the group consisting of a trivalent metallic element; M(IV)' represents one element or two or more elements selected from the group consisting of a tetravalent metallic element; A represents one or more monovalent metallic elements selected from the group consisting of Li, Na, and K; p represents a number that satisfies $0 < p \leq 0.2$; and a, b, and n represent numbers that satisfy $0 \leq a$, $0 \leq b$, $0 < a+b < 1$, $0 \leq n$, and $0.002 \leq (3n+2)a/4 \leq 0.9$.

A Ce-activated fluorescent substance having a crystal structure in which the host crystal satisfies the above requirement is (i) excited by blue light efficiently, and also (ii) thus excited by blue light to emit light that satisfies the requirement of the present invention.

The light-emitting device of the present invention may preferably be arranged such that the Ce-activated fluorescent substance is a solid solution crystal that contains Ce and oxygen each in a form of a solid solution in a crystal having a composition of

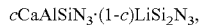

$$cCaAlSiN_3 \cdot (1-c)LiSi_2N_3,$$

where $0.2 \leq c \leq 0.8$.

The above arrangement particularly increases the luminous efficiency of the orange fluorescent substance. This arrangement makes it possible to produce a light-emitting device that is higher in luminous efficiency.

The light-emitting device of the present invention may preferably be arranged such that the solid solution crystal containing Ce and oxygen each in the form of a solid solution has a Ce concentration of not more than 6 weight %.

The above arrangement makes it possible to produce a light-emitting device that is high in luminous efficiency and excellent in temperature characteristic.

The light-emitting device of the present invention may preferably be arranged such that the solid solution crystal containing Ce and oxygen each in the form of a solid solution has a Li concentration in a crystal of not less than 1.5 weight % and not more than 4 weight %.

The above arrangement makes it possible to produce a light-emitting device that is high in luminous efficiency and excellent in color rendering property.

The light-emitting device of the present invention may preferably be arranged such that the orange fluorescent substance has an excitation spectrum that has an excitation peak at a wavelength of not less than 440 nm and not more than 470 nm; and the orange fluorescent substance has a fluorescence spectrum that has a light emission peak at a wavelength of not less than 580 nm and not more than 620 nm.

The orange fluorescent substance having an excitation spectrum that satisfies the above requirement makes it possible to produce a light-emitting device that is higher in luminous efficiency.

The light-emitting device of the present invention may preferably be arranged such that the green fluorescent substance is a Eu-activated β-sialon fluorescent substance.

The Eu-activated β-sialon fluorescent substance is (i) excited by blue light efficiently, and also (ii) thus excited by blue light to emit light that satisfies the requirement of the present invention.

The light-emitting device of the present invention may preferably be arranged such that the Eu-activated β-sialon fluorescent substance has an absorptance of not more than 10% with respect to light having a wavelength of 600 nm.

The above arrangement reduces unnecessary absorption of orange light by the green fluorescent substance, and thus improves the luminous efficiency of the light-emitting device.

EXAMPLES

The following describes the present invention in further detail with reference to Examples and Comparative Examples. The present invention is, however, not limited to such Examples.

[1] Preparation of Fluorescent Substances

Production Example 1-1

Preparation of Orange Fluorescent Substance <1>

A crystal having the composition $0.2CaAlSiN_3 \cdot 0.8LiSi_2N_3$ and serving as a host crystal was activated by Ce to synthesize a fluorescent substance.

To prepare a compound having the theoretical composition formula $Ce_{0.0017}Li_{0.13}Ca_{0.0313}Al_{0.033}Si_{0.30}O_{0.0025}N_{0.50}$, raw material powder was weighed, at a composition ratio of $Si_3N_4$:74.3 mass %, AlN:7.24 mass %, $Li_3N$:8.2 mass %, $Ca_3N_2$:8.73 mass %, and $CeO_2$:1.52 mass %, to have a whole quantity of 2 g. The weighed raw material powder was mixed in a mortar with an agate pestle for 10 minutes. The resulting mixture was then allowed to spontaneously drop into and thus fill a boron nitride crucible (volume filling rate: 38%).

The powder was weighed and mixed inside a glove box that was capable of retaining a nitrogen atmosphere containing not more than 1 ppm of moisture and not more than 1 ppm of oxygen.

The above mixture powder in the boron nitride crucible was set in an electric furnace based on a graphite resistance heating system. The mixture powder was fired through the following operation: First, vacuum was created as a firing atmosphere with use of a diffusion pump. The temperature was raised from room temperature to 800° C. at a rate of 1200° C. per hour. At 800° C., nitrogen with a purity of 99.999% by volume was introduced, and the pressure was set at 0.92 MPa. The temperature was then raised to a firing temperature of 1800° C. at a rate of 600° C. per hour. The mixture powder was fired at the firing temperature of 1800° C. for 2 hours. The fired product resulting from the firing was washed with water for removal of unnecessary $Li_3N$. The resultant product was next coarsely ground, and then manually ground in an alumina mortar. This provided a fluorescent substance powder. This fluorescent substance powder was measured for its Li concentration with use of an ICP (produced by Nippon Jarrell-Ash Co. Ltd.; IRIS Advantage). The measurement showed a Li concentration of 3.84 weight %. This Li concentration based on the ICP measurement was lower than 4.9 weight % for the theoretical composition. This is presumed to have been due to volatilization of Li during the firing and the washing after the firing. A similar ICP measurement showed a Ce concentration of 1.25 weight %.

The above fluorescent substance powder, whose raw material powder contained an oxide material, was a solid solution crystal containing Ce and oxygen each in the form of a solid solution.

The above-obtained fluorescent substance powder was subjected to a powder X ray diffraction measurement (XRD) with use of a Kα ray of Cu. FIG. 34 is an XRD chart illustrating the results. This measurement confirmed that the above fluorescent substance powder had a crystal structure including a $CaAlSiN_3$ phase as a main phase. The fluorescent substance powder was then irradiated with light of a lamp designed to emit light having a wavelength of 365 nm. This confirmed that the fluorescent substance powder emitted orange light.

The term "main phase" as used in the present specification refers to a phase that is present in an amount larger than the amount of any other phase, and specifically refers to a phase that is present at a proportion of 50 weight % or greater.

FIG. 2 is a graph illustrating an emission spectrum of the above-prepared fluorescent substance powder, the graph indicating an emission intensity (in an arbitrary unit) along its ordinate and a wavelength (in nm) along its abscissa. FIG. 3 is a graph illustrating an excitation spectrum of the above-prepared fluorescent substance powder, the graph indicating an absorbance (in an arbitrary unit) along its ordinate and a wavelength (in nm) along its abscissa.

The excitation spectrum and emission spectrum illustrated in FIGS. 2 and 3 of the fluorescent substance powder are the results of a measurement involving use of F-4500 (produced by Hitachi, Ltd.). The excitation spectrum was measured by scanning the respective intensities of light emission peaks. The emission spectrums were measured while the fluorescent substance powder was excited by light beams having respective peak wavelengths of the absorption spectrums.

The emission spectrum illustrated in FIG. 2 has chromaticity coordinates of (u',v')=(0.264, 0.557), a peak wavelength of 596 nm, and a half width of 146 nm.

Figure 4:
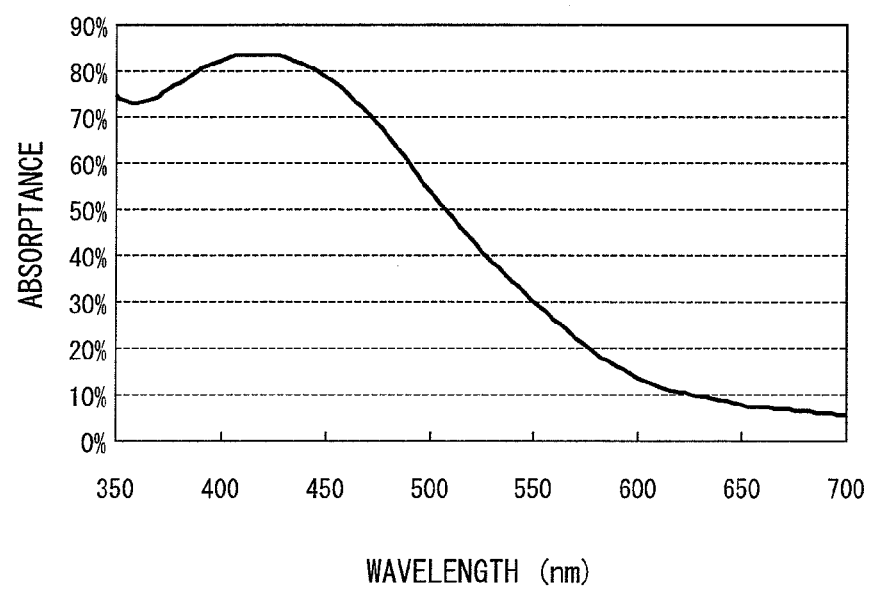
FIG. 4 is a graph illustrating an absorption spectrum of the fluorescent substance powder prepared in Production Example 1-1.

FIG. 4 illustrates an absorption spectrum of the fluorescent substance powder prepared in the present production example. The fluorescent substance of the present production example had an absorptance that satisfied ABS(520)/ABS(MAX)=52%, where ABS(MAX) represents a maximum value, within a range of wavelengths longer than 420 nm, of the absorptance of the fluorescent substance, and ABS(520) represents an absorptance of the fluorescent substance at a wavelength of 520 nm.

The absorption spectrum illustrated in FIG. 4 of the fluorescent substance powder is the results of a measurement involving use of a measurement system combining MCPD-7000 (produced by Otsuka Electronics Ltd.) with an integrating sphere.

Production Example 1-2

Preparation of Orange Fluorescent Substance <2>

A crystal having the composition $0.3CaAlSiN_3 \cdot 0.7LiSi_2N_3$ and serving as a host crystal was activated by Ce to synthesize a fluorescent substance.

To prepare a compound having the theoretical composition formula $Ce_{0.0017}Li_{0.12}Ca_{0.0483}Al_{0.050}Si_{0.28}O_{0.0025}N_{0.50}$, raw material powder was weighed, at a composition ratio of $Si_3N_4$:68.3 mass %, AlN:10.6 mass %, $Li_3N$:7.0 mass %, $Ca_3N_2$:12.7 mass %, and $CeO_2$:1.48 mass %, to have a whole quantity of 2 g. The weighed raw material powder was mixed in a mortar with an agate pestle for 10 minutes. The resulting mixture was then allowed to spontaneously drop into and thus fill a boron nitride crucible (volume filling rate: 38%).

The powder was weighed and mixed inside a glove box that was capable of retaining a nitrogen atmosphere containing not more than 1 ppm of moisture and not more than 1 ppm of oxygen.

The above mixture powder in the boron nitride crucible was set in an electric furnace based on a graphite resistance heating system. The mixture powder was fired through the following operation: First, vacuum was created as a firing atmosphere with use of a diffusion pump. The temperature was raised from room temperature to 800° C. at a rate of 1200° C. per hour. At 800° C., nitrogen with a purity of 99.999% by volume was introduced, and the pressure was set at 0.92 MPa. The temperature was then raised to a firing temperature of 1800° C. at a rate of 600° C. per hour. The mixture powder was fired at the firing temperature of 1800° C. for 2 hours. The fired product resulting from the firing was washed with water for removal of unnecessary $Li_3N$. The resultant product was next coarsely ground, and then manually ground in an alumina mortar. This provided a fluorescent substance powder. This fluorescent substance powder was measured for its Li concentration with use of an ICP (produced by Nippon Jarrell-Ash Co. Ltd.; IRIS Advantage). The measurement showed a Li concentration of 3.24 weight %. This Li concentration based on the ICP measurement was lower than 4.17 weight % for the theoretical composition. This is presumed to have been due to volatilization of Li during the firing and the washing after the firing. A similar ICP measurement showed a Ce concentration of 1.21 weight %.

The above fluorescent substance powder, whose raw material powder contained an oxide material, was a solid solution crystal containing Ce and oxygen each in the form of a solid solution.

The above-obtained fluorescent substance powder was subjected to a powder X ray diffraction measurement (XRD) with use of a Kα ray of Cu. FIG. 35 is an XRD chart illustrating the results. This measurement confirmed that the above fluorescent substance powder had a crystal structure including a $CaAlSiN_3$ phase as a main phase. The fluorescent substance powder was then irradiated with light of a lamp designed to emit light having a wavelength of 365 nm. This confirmed that the fluorescent substance powder emitted orange light.

Figure 5:
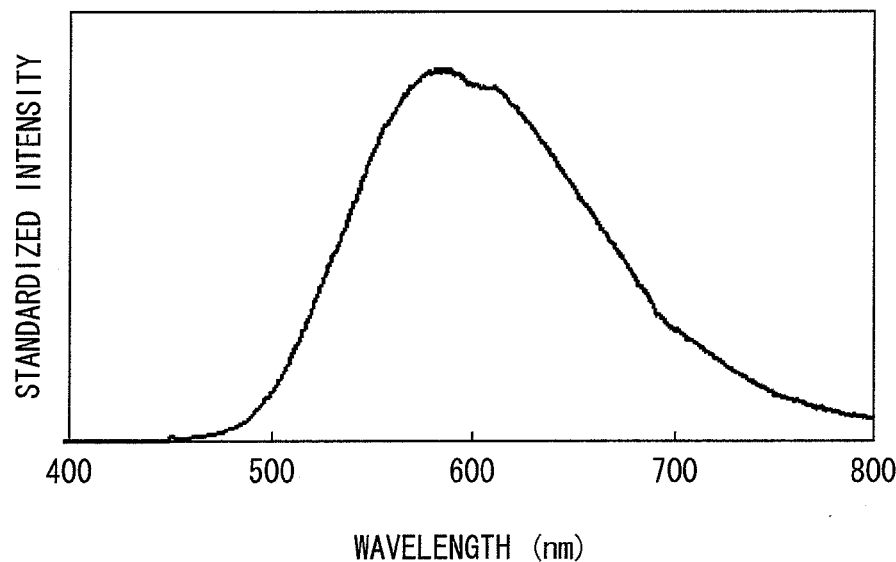
FIG. 5 is a graph illustrating an emission spectrum of a fluorescent substance powder prepared in Production Example 1-2.
Figure 6:
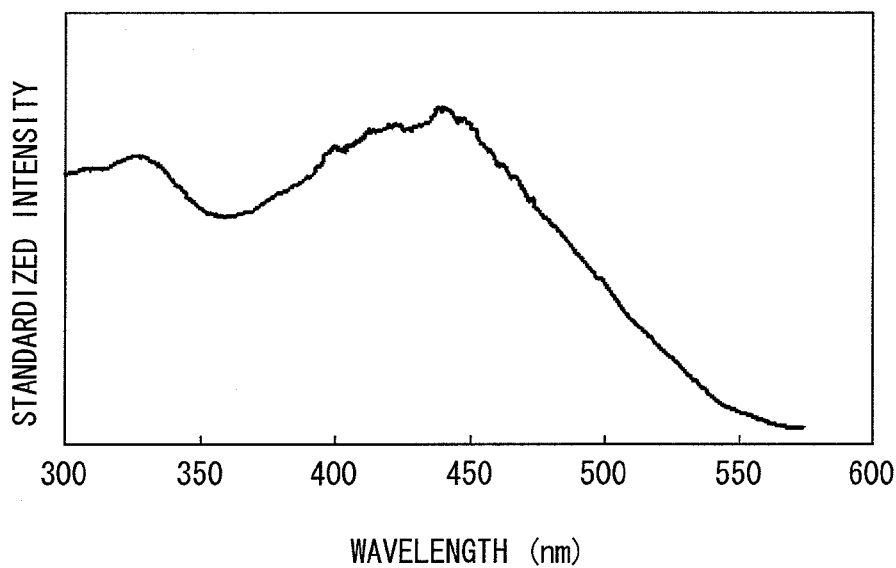
FIG. 6 is a graph illustrating an excitation spectrum of the fluorescent substance powder prepared in Production Example 1-2.

FIG. 5 is a graph illustrating an emission spectrum of the fluorescent substance powder prepared in the present production example, the graph indicating an emission intensity (in an arbitrary unit) along its ordinate and a wavelength (in nm) along its abscissa. FIG. 6 is a graph illustrating an excitation spectrum of the fluorescent substance powder prepared in the present production example, the graph indicating an absorbance (in an arbitrary unit) along its ordinate and a wavelength (in nm) along its abscissa.

The emission spectrum and excitation spectrum illustrated in FIGS. 5 and 6 of the fluorescent substance powder are the results of a measurement involving use of F-4500 (produced by Hitachi, Ltd.). The excitation spectrum was measured by scanning the respective intensities of light emission peaks. The emission spectrums were measured while the fluorescent substance powder was excited by light beams having respective peak wavelengths of the absorption spectrums.

The emission spectrum illustrated in FIG. 5 has chromaticity coordinates of (u',v')=(0.263, 0.558), a peak wavelength of 592 nm, and a half width of 142 nm.

Figure 7:
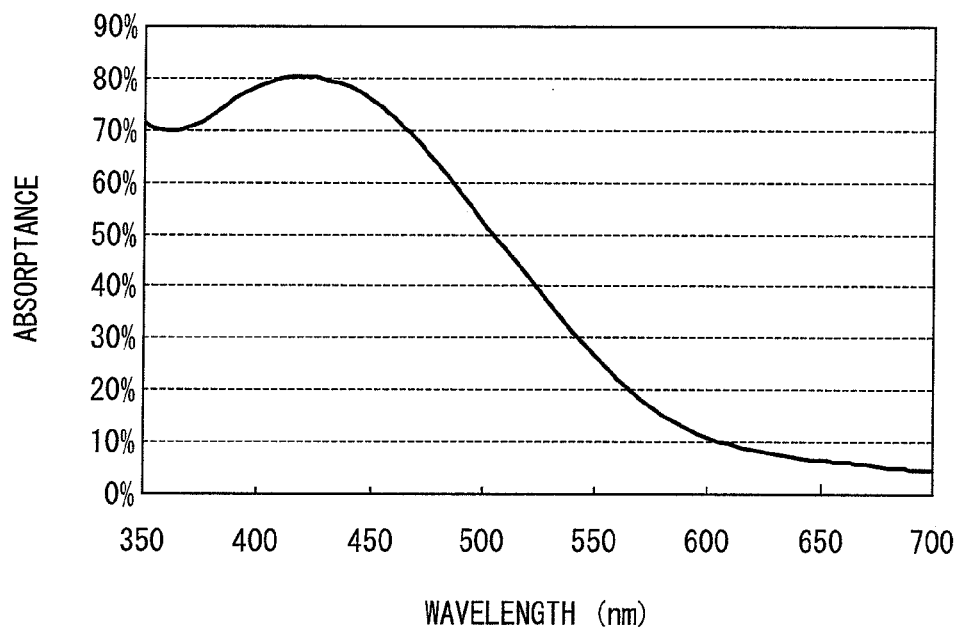
FIG. 7 is a graph illustrating an absorption spectrum of the fluorescent substance powder prepared in Production Example 1-2.

FIG. 7 illustrates an absorption spectrum of the fluorescent substance powder prepared in the present production example. The fluorescent substance of the present production example had an absorptance that satisfied ABS(520)/ABS(MAX)=51%, where ABS(MAX) represents a maximum value, within a range of wavelengths longer than 420 nm, of the absorptance of the fluorescent substance, and ABS(520) represents an absorptance of the fluorescent substance at a wavelength of 520 nm.

The absorption spectrum illustrated in FIG. 7 of the fluorescent substance powder is the results of a measurement involving use of a measurement system combining MCPD-7000 (produced by Otsuka Electronics Ltd.) with an integrating sphere.

Production Example 1-3-1 Through 1-3-11

Preparation of Orange Fluorescent Substance <3>

Various solid solution crystals each containing Ce and oxygen each in the form of a solid solution were synthesized to vary from one another in Ce concentration and Li concentration by mixing $Si_3N_4$, AlN, $Li_3N$, $Ca_3N_2$, and $CeO_2$ at composition ratios shown in Table 1. Table 2 shows the respective Ce concentrations and Li concentrations as a result of an ICP measurement.

TABLE 1

| | Raw material powder mixing ratio | | | | |
|---|---|---|---|---|---|
| | $CeO_2$ (wt %) | $Li_3N$ (wt %) | $Ca_3N_2$ (wt %) | AlN (wt %) | $Si_3N_4$ (wt %) |
| Production Example 1-3-1 | 1.30 | 1.75 | 29.84 | 24.75 | 42.36 |
| Production Example 1-3-2 | 1.33 | 2.69 | 26.76 | 22.19 | 47.02 |
| Production Example 1-3-3 | 1.37 | 3.68 | 23.52 | 19.51 | 51.93 |
| Production Example 1-3-4 | 1.40 | 4.72 | 20.11 | 16.68 | 57.09 |
| Production Example 1-3-5 | 1.44 | 5.82 | 16.51 | 13.70 | 62.53 |
| Production Example 1-3-6 | 3.07 | 9.35 | 4.41 | 3.66 | 79.50 |
| Production Example 1-3-7 | 1.48 | 6.98 | 12.73 | 10.56 | 68.26 |
| Production Example 1-3-8 | 2.92 | 6.88 | 12.54 | 10.40 | 67.26 |
| Production Example 1-3-9 | 5.66 | 6.68 | 12.19 | 10.11 | 65.36 |
| Production Example 1-3-10 | 7.59 | 1.28 | 25.41 | 21.07 | 44.65 |
| Production Example 1-3-11 | 12.03 | 1.22 | 24.18 | 20.06 | 42.50 |

TABLE 2

| | ICP measurement results | |
|---|---|---|
| | Li (wt %) | Ce (wt %) |
| Production Example 1-3-1 | 0.23 | 1.07 |
| Production Example 1-3-2 | 0.83 | 1.09 |
| Production Example 1-3-3 | 1.43 | 1.12 |
| Production Example 1-3-4 | 2.04 | 1.15 |
| Production Example 1-3-5 | 2.64 | 1.18 |
| Production Example 1-3-6 | 4.43 | 2.53 |
| Production Example 1-3-7 | 3.24 | 1.21 |
| Production Example 1-3-8 | 3.23 | 2.40 |
| Production Example 1-3-9 | 3.19 | 4.66 |
| Production Example 1-3-10 | 0.20 | 6.22 |
| Production Example 1-3-11 | 0.21 | 9.91 |

Figure 30:
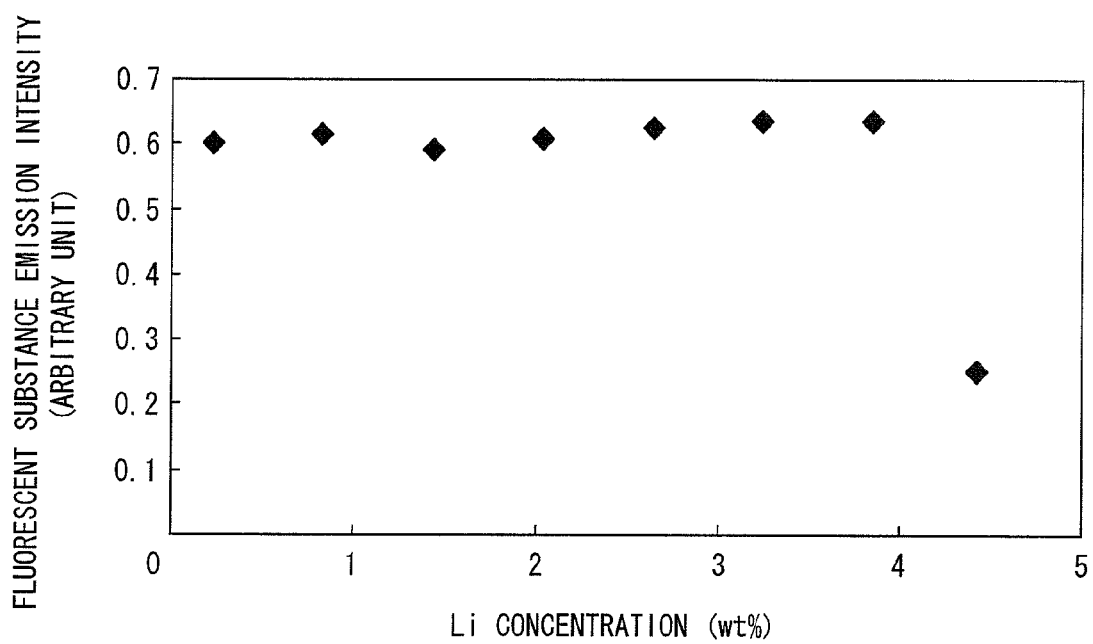
FIG. 30 is a graph illustrating dependence of an emission intensity on a Li concentration for a solid solution crystal containing Ce and oxygen each in the form of a solid solution.

FIG. 30 is a graph illustrating dependence of the emission intensity of each of the above-prepared solid solution crystals on the Li concentration.

As illustrated in FIG. 30, the emission intensity tends to be high with a Li concentration of not more than 4 weight % in a solid solution crystal. The emission intensity is low in the case where the Ce concentration and Li concentration of a solid solution crystal fall outside the above range. This is presumably because, for example, (i) an element contributing to light emission has too low a concentration, or (ii) a different phase is generated.

FIGS. 31 and 32 are each a graph illustrating dependence, on the ambient temperature, of an emission intensity of each of the above-prepared solid solution crystals which emission intensity is achieved by exciting the solid solution crystal by light having a wavelength of 450 nm. FIGS. 31 and 32 indicate that (i) an increase in Li concentration of a solid solution crystal causes no decrease in emission intensity achieved under a high-temperature environment, whereas an increase in Ce concentration of a solid solution crystal tends to cause a decrease in emission intensity achieved under a high-temperature environment, and that (ii) the Ce concentration of a solid solution crystal is preferably not more than 6 weight %. FIGS. 31 and 32 further indicate that the Li concentration of a solid solution crystal is not particularly limited in relation to the emission intensity under a high-temperature environment.

FIG. 33 illustrates dependence, on the Li concentration, of the half width of an emission spectrum of each of the above solid solution crystals which emission spectrum is achieved by exciting the solid solution crystal by light having a wavelength of 450 nm. FIG. 33 indicates that a Li concentration of 1.5 weight % or more tends to particularly increase the half width of the emission spectrum.

The emission intensity mentioned in the present production example was measured with use of a device combining MCPD-7000 (produced by Otsuka Electronics Ltd.) with an integrating sphere.

Production Example 2-1

Preparation of Green Fluorescent Substance
[Eu-Activated β-Sialon Fluorescent Substance]

To prepare a Eu-activated β-sialon fluorescent substance having the composition formula $Si_{6-z'}Al_{z'}O_{z'}N_{8-z'}$ in which $z'=0.23$ and activated by 0.09 at. % of Eu, raw materials were weighed at a composition of 95.82 mass % of a silicon nitride powder, 3.37 mass % of aluminum nitride powder, and 0.81 mass % of europium oxide powder. The weighed materials were mixed in a mortar made of a silicon nitride sintered body and with a pestle for 10 or more minutes. This provided a powder aggregate. This powder aggregate was then allowed to spontaneously drop into and thus fill a boron nitride crucible.

Next, the above crucible was set in a pressure electric furnace based on a graphite resistance heating system. Then, vacuum was created as a firing atmosphere with use of a diffusion pump. The powder aggregate was heated from room temperature to 800° C. at a rate of 500° C. per hour. At 800° C., nitrogen with a purity of 99.999% by volume was introduced, and the pressure was set at 1 MPa. The temperature was then raised to 1900° C. at a rate of 500° C. per hour. The powder aggregate was kept at that temperature for 8 hours. This provided a fluorescent substance sample. The resulting fluorescent substance sample was ground in an agate mortar, and then treated in a mixed acid containing 50% hydrofluoric acid and 70% nitric acid at a ratio of 1:1. This provided a fluorescent substance powder.

The above fluorescent substance powder was subjected to a powder X ray diffraction measurement (XRD) with use of a Kα ray of Cu. FIG. 36 is an XRD chart illustrating the results. This chart indicating the results of the measurement for the fluorescent substance powder confirmed that the fluorescent substance powder had a β-sialon structure throughout. The fluorescent substance powder was then irradiated with light of a lamp designed to emit light having a wavelength of 365 nm. This confirmed that the fluorescent substance powder emitted green light.

Figure 8:
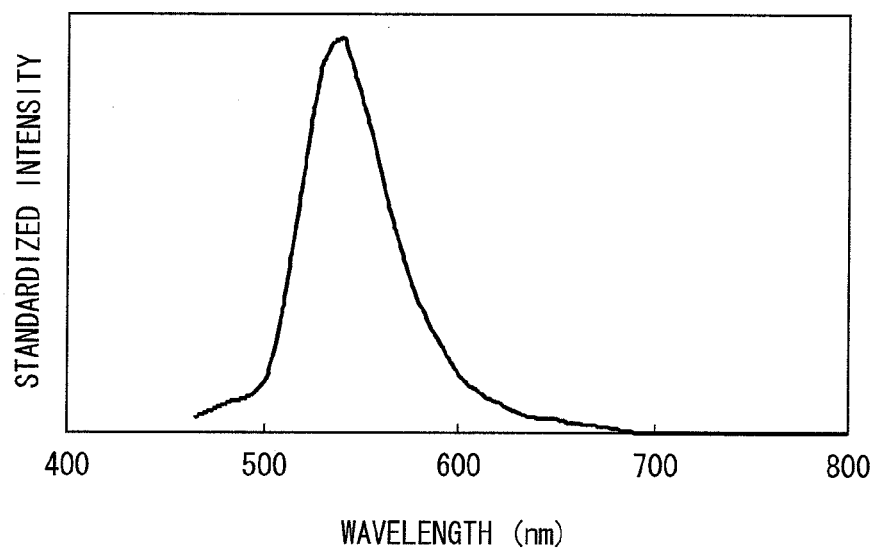
FIG. 8 is a graph illustrating an emission spectrum of a fluorescent substance powder prepared in Production Example 2-1.
Figure 13:
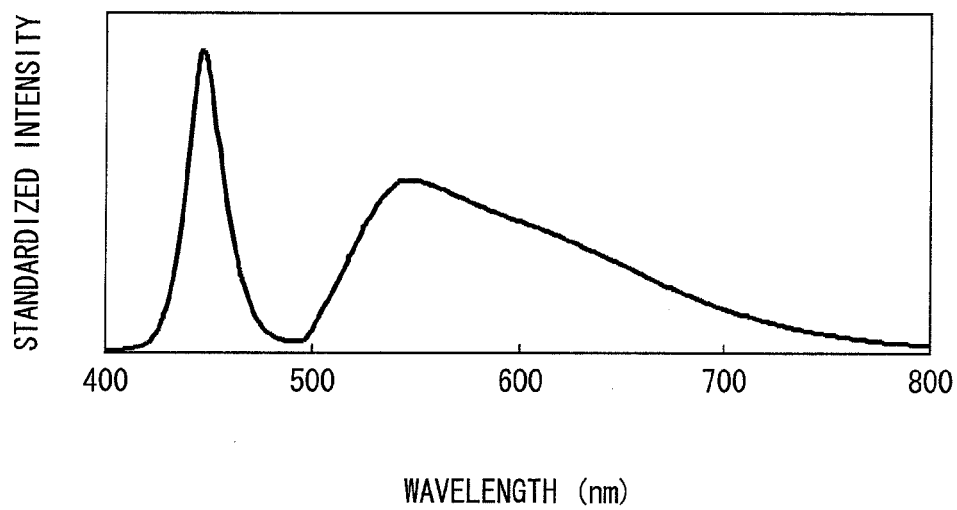
FIG. 13 is a graph illustrating an emission spectrum of a light-emitting device prepared in Example 2.
Figure 14:
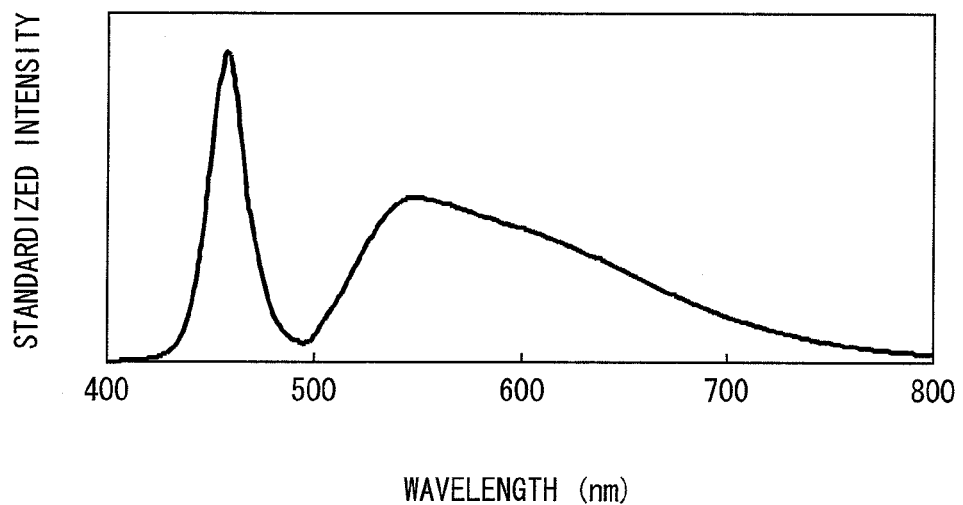
FIG. 14 is a graph illustrating an emission spectrum of a light-emitting device prepared in Example 3.
Figure 15:
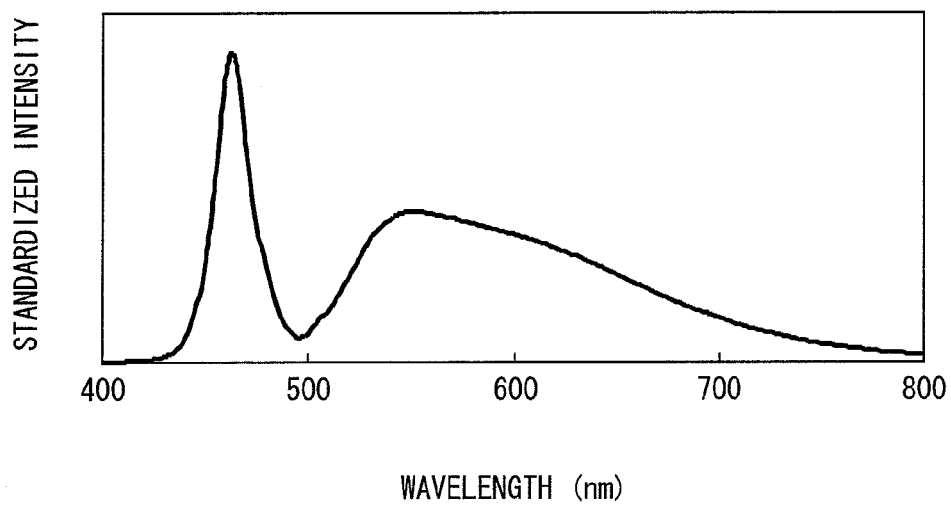
FIG. 15 is a graph illustrating an emission spectrum of a light-emitting device prepared in Example 4.
Figure 16:
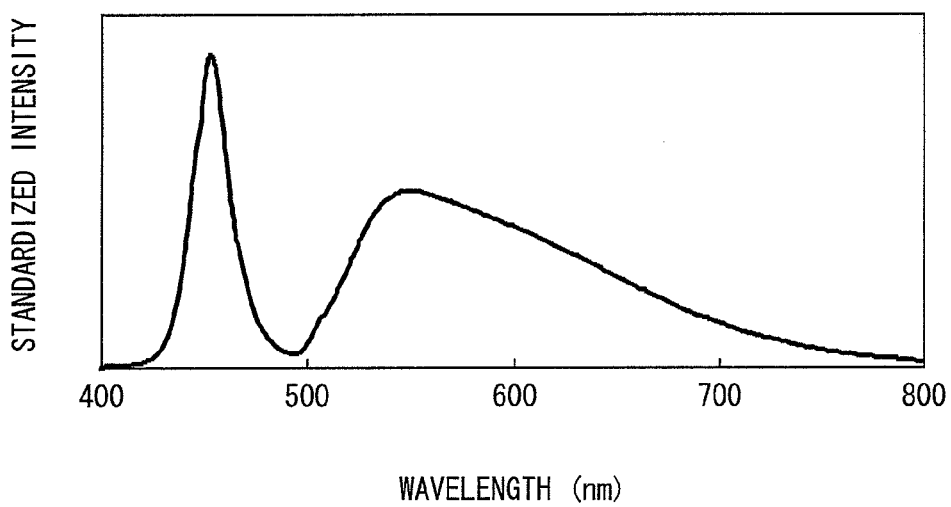
FIG. 16 is a graph illustrating an emission spectrum of a light-emitting device prepared in Example 5.
Figure 17:
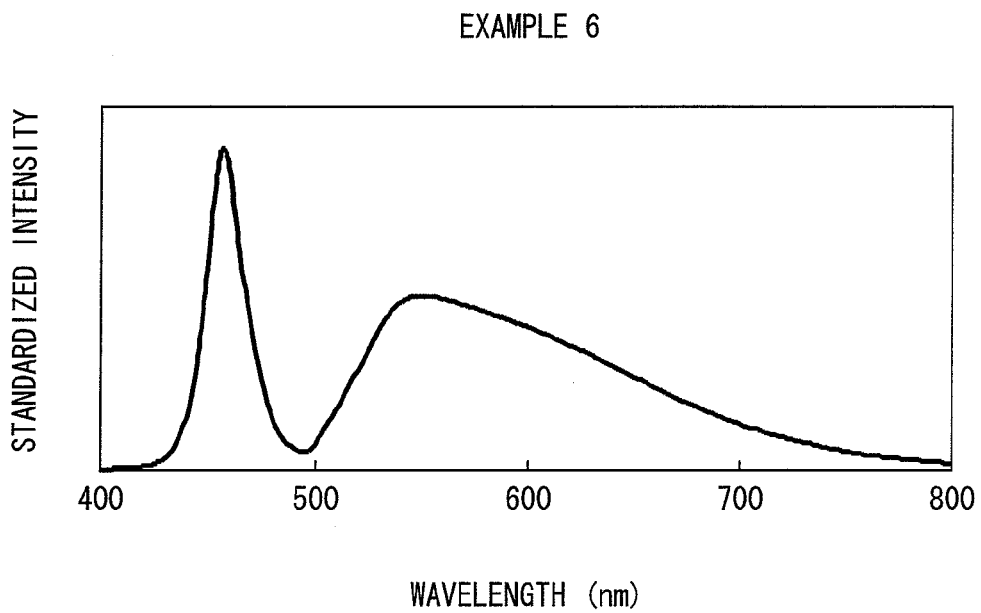
FIG. 17 is a graph illustrating an emission spectrum of a light-emitting device prepared in Example 6.
Figure 18:
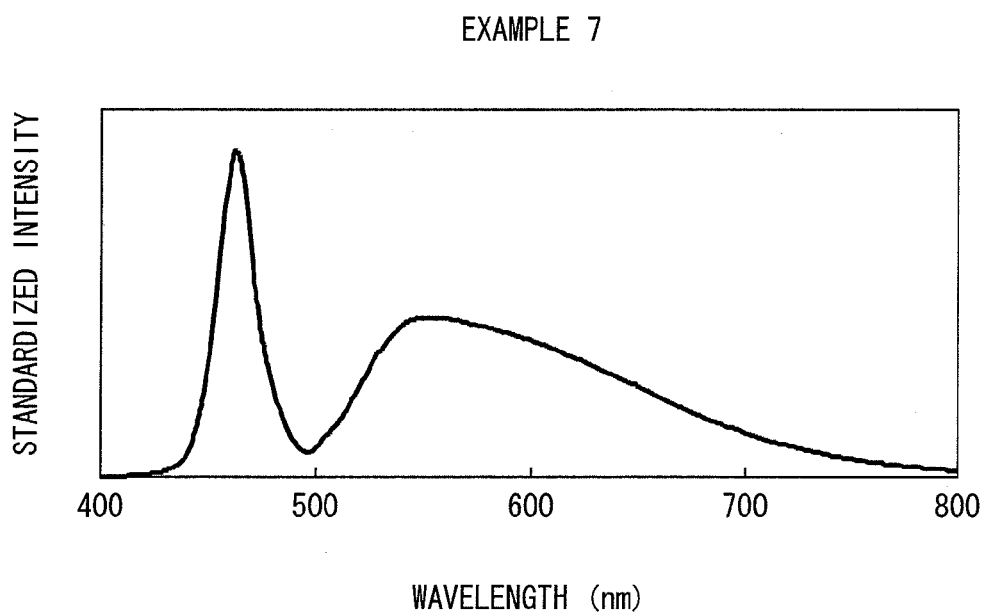
FIG. 18 is a graph illustrating an emission spectrum of a light-emitting device prepared in Example 7.
Figure 19:
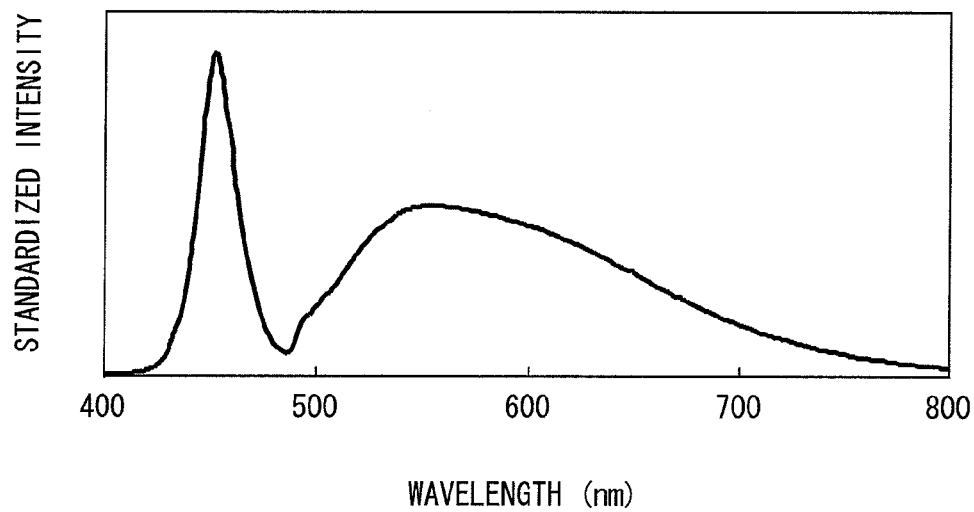
FIG. 19 is a graph illustrating an emission spectrum of a light-emitting device prepared in Example 8.

A measurement was made, with use of F-4500 (produced by Hitachi, Ltd.), of an emission spectrum achieved by exciting the above-obtained Eu-activated β-sialon fluorescent substance powder by light having a wavelength of 450 nm. The measurement showed an emission spectrum illustrated in FIG. 8. In FIG. 8, the ordinate indicates an emission intensity (in an arbitrary unit), whereas the abscissa indicates a wavelength (in nm).

The emission spectrum illustrated in FIG. 8 has chromaticity coordinates of (u',v')=(0.129, 0.570), a peak wavelength of 540 nm, and a half width of 53 nm. The above-obtained fluorescent substance powder was measured, with use of MCPD-7000 (produced by Otsuka Electronics Ltd.), for its absorptance with respect to light having a wavelength of 600 nm. The measurement showed an absorptance of 9.1%.

Production Example 2-2

Preparation of Green Fluorescent Substance
[Eu-Activated BSON Fluorescent Substance]

Raw materials were mixed in an agate mortar with a pestle to achieve a composition of 17.12 mass % of β silicon nitride powder, 29.32 mass % of silicon oxide powder, 50.75 mass % of barium carbonate powder, and 2.81 mass % of europium oxide powder. This provided 50 g of a powder mixture. This resulting powder mixture was mixed in 150 cc of ethanol with use of a rolling ball mill including an agate ball and a nylon pot. This provided a slurry.

The above-obtained slurry was dried in an oven at 100° C. This provided a powder aggregate, which was then ground with use of a dry rolling ball mill including an agate ball and a nylon pot. This provided fine particles each having a particle size of approximately 10 µm. The fine particles thus obtained were filled in an alumina crucible and compression-molded under a slight pressure. Next, the fine particles were fired in the air at 1100° C. for 3 hours. The fired product thus obtained was then ground in an agate mortar. This provided a precursor sample.

Next, the above crucible was set in a pressure electric furnace based on a graphite resistance heating system. Then, vacuum was created as a firing atmosphere with use of a diffusion pump. The powder aggregate was heated from room temperature to 800° C. at a rate of 500° C. per hour. At 800° C., nitrogen with a purity of 99.999% by volume was introduced, and the pressure was set at 1 MPa. The temperature was then raised to 1300° C. at a rate of 500° C. per hour. The powder aggregate was kept at that temperature for 2 hours. This provided a fluorescent substance sample. The resulting fired product was ground in an agate mortar, and was again filled in an alumina crucible to be compression-molded under a slight pressure. Next, the fired product was fired in a nitrogen atmosphere at 1300° C. for 48 hours. The resulting fired product was then ground in an agate mortar. This provided a fluorescent substance powder.

The above fluorescent substance powder was subjected to a powder X ray diffraction measurement (XRD) with use of a Kα ray of Cu. A chart indicating the results of the measurement for the fluorescent substance powder confirmed that the fluorescent substance powder had a BSON structure throughout. The fluorescent substance powder was then irradiated with light of a lamp designed to emit light having a wavelength of 365 nm. This confirmed that the fluorescent substance powder emitted green light.

A measurement was made, with use of F-4500 (produced by Hitachi, Ltd.), of an emission spectrum achieved by exciting the above-obtained Eu-activated BSON fluorescent substance powder by light having a wavelength of 450 nm. The measurement showed an emission spectrum illustrated in FIG. 9. In FIG. 9, the ordinate indicates an emission intensity (in an arbitrary unit), whereas the abscissa indicates a wavelength (in nm). The emission spectrum illustrated in FIG. 9 has chromaticity coordinates of (u',v')=(0.116, 0.566), a peak wavelength of 528 nm, and a half width of 69 nm.

Comparative Production Example 1

Preparation of $Sr_3SiO_5$:Eu Fluorescent Substance

Raw materials were weighed in the air to achieve a predetermined composition of 86.13 mass % of $SrCO_3$ powder, 2.07 mass % of $Eu_2O_3$ powder, and 11.80 mass % of $SiO_2$ powder, and mixed with use of a rolling ball mill including an agate ball and a nylon pot. This provided a powder mixture. The mixture thus obtained was filled in a quartz crucible, and fired in a reducing atmosphere with $N_2(95\%)+H_2(5\%)$ at 1400° C. for 5 hours. The resulting fired product was then ground in an agate mortar. This provided a fluorescent substance powder.

The $Sr_3SiO_5$:Eu fluorescent substance powder thus obtained was irradiated with light of a lamp designed to emit light having a wavelength of 365 nm. This confirmed that the fluorescent substance powder emitted orange light. A measurement was made, with use of F-4500 (produced by Hitachi, Ltd.), of an emission spectrum achieved by exciting the above powder by light having a wavelength of 450 nm. The measurement showed an emission spectrum illustrated in FIG. 10.

In FIG. 10, the ordinate indicates an emission intensity (in an arbitrary unit), whereas the abscissa indicates a wavelength (in nm). The emission spectrum illustrated in FIG. 10 has chromaticity coordinates of (u',v')=(0.294, 0.555), a peak wavelength of 587 nm, and a half width of 76 nm. A further measurement was made, with use of MCPD-7000, of dependence of the absorptance on the wavelength. The measurement showed that ABS(520)/ABS(MAX)=0.78.

Comparative Production Example 2

Preparation of $ZnSe_{0.1}S_{0.9}$:Cu Fluorescent Substance

Raw materials were weighed in a $N_2$ atmosphere to achieve a composition of 84.75 mass % of ZnS powder, 13.95 mass % of ZnSe powder, and 1.30 mass % of $CuCl_2$ powder. ZnS powder and ZnSe powder were mixed at the above ratio in an agate mortar for 10 or more minutes. This provided 50 g of a powder mixture. Next, the $CuCl_2$ powder was added to 150 ml of methanol. This was mixed together with 50 g of the above-obtained mixture of ZnS powder and ZnSe powder with use of a rolling ball mill including an agate ball and a nylon pot. This provided a slurry.

The above-obtained slurry was dried in an oven at 100° C. This provided a powder aggregate, which was then ground with use of a dry rolling ball mill including an agate ball and a nylon pot. This provided fine particles each having a particle size of approximately 10 µm. The fine particles thus obtained were filled in a quartz crucible, and fired in an Ar atmosphere at 1000° C. for 2 hours. The resulting fired powder was again ground in a dry rolling ball mill. This provided a $ZnSe_{0.1}S_{0.9}$:Cu fluorescent substance powder.

The $ZnSe_{0.1}S_{0.9}$:Cu fluorescent substance powder thus obtained was irradiated with light of a lamp designed to emit light having a wavelength of 365 nm. This confirmed that the fluorescent substance powder emitted orange light.

A measurement was made, with use of F-4500 (produced by Hitachi, Ltd.), of an emission spectrum achieved by exciting the above powder by light having a wavelength of 450 nm. The measurement showed an emission spectrum illustrated in FIG. 11.

In FIG. 11, the ordinate indicates an emission intensity (in an arbitrary unit), whereas the abscissa indicates a wavelength (in nm). The emission spectrum illustrated in FIG. 11 has chromaticity coordinates of (u',v')=(0.311, 0.553), a peak wavelength of 585 nm, and a half width of 86 nm.

Comparative Production Example 3

Preparation of Eu-Activated CaAlSiN$_3$ Fluorescent Substance

Raw materials were weighed in prescribed amounts to achieve a composition of 29.741 mass % of aluminum nitride powder, 33.925 mass % of a silicon nitride powder, 35.642 mass % of calcium nitride powder, and 0.692 mass % of europium nitride powder, and mixed in a mortar made of a silicon nitride sintered body and with a pestle for 10 or more minutes. This provided a powder aggregate. The europium nitride was synthesized by nitriding metal europium in ammonia.

The above powder aggregate was allowed to spontaneously drop into a boron nitride crucible 20 mm in diameter and 20 mm in height. The powder was weighed, mixed, and molded inside a glove box that was capable of retaining a nitrogen atmosphere containing not more than 1 ppm of moisture and not more than 1 ppm of oxygen.

Next, the above crucible was set in a pressure electric furnace based on a graphite resistance heating system. Then, nitrogen with a purity of 99.999% by volume was introduced, and the pressure was set at 1 MPa. The temperature was then raised to 1800° C. at a rate of 500° C. per hour. The powder aggregate was further kept at 1800° C. for 2 hours. This provided a fluorescent substance sample. The resulting fluorescent substance sample was ground in an agate mortar. This provided a fluorescent substance powder. This fluorescent substance powder was subjected to a powder X ray diffraction measurement (XRD) with use of a Kα ray of Cu. This measurement confirmed that the above fluorescent substance powder had a crystal structure of CaAlSiN$_3$. The fluorescent substance powder was then irradiated with light of a lamp designed to emit light having a wavelength of 365 nm. This confirmed that the fluorescent substance powder emitted red light.

FIG. 28 is a graph illustrating an emission spectrum of the above-obtained fluorescent substance powder, the graph indicating an emission intensity (in an arbitrary unit) along its ordinate and a wavelength (in nm) along its abscissa.

The emission spectrum illustrated in FIG. 28 of the fluorescent substance powder are the results of a measurement involving use of F-4500 (produced by Hitachi, Ltd.), the measurement having been made when the fluorescent substance powder was excited by light having a wavelength of 450 nm. The emission spectrum illustrated in FIG. 28 has chromaticity coordinates of (u',v')=(0.460, 0.530), a peak wavelength of 650 nm, and a half width of 94 nm.

[2] Preparation of Semiconductor Light-Emitting Device

Examples 1 Through 8

The fluorescent substances shown in Table 3 were mixed with a silicone resin (product name: KER2500; produced by Shinetsu Silicone) to be dispersed therein at the mass ratios shown in Table 3 to prepare mold resins. Semiconductor light-emitting devices of the respective Examples were thus prepared to each have the structure illustrated in FIG. 1.

TABLE 3

| | LED peak wavelength (nm) | Orange fluorescent substance | Green fluorescent substance | Resin/fluorescent substance weight ratio | Green fluorescent substance/orange fluorescent substance weight ratio |
|---|---|---|---|---|---|
| Example 1 | 445 | Production Example 1-1 | Production Example 2-1 | 5.917 | 0.496 |
| Example 2 | 450 | Production Example 1-1 | Production Example 2-1 | 5.946 | 0.479 |
| Example 3 | 455 | Production Example 1-1 | Production Example 2-1 | 6.048 | 0.457 |
| Example 4 | 460 | Production Example 1-1 | Production Example 2-1 | 6.257 | 0.430 |
| Example 5 | 450 | Production Example 1-2 | Production Example 2-1 | 5.958 | 0.476 |
| Example 6 | 455 | Production Example 1-2 | Production Example 2-1 | 6.040 | 0.456 |
| Example 7 | 460 | Production Example 1-2 | Production Example 2-1 | 6.290 | 0.429 |
| Example 8 | 450 | Production Example 1-1 | Production Example 2-2 | 5.750 | 0.459 |
| Comparative Example 1 | 450 | Comparative Production Example 1 | Production Example 2-1 | 6.154 | 0.970 |
| Comparative Example 2 | 455 | Comparative Production Example 2 | Production Example 2-1 | 4.890 | 0.332 |

The semiconductor light-emitting devices each included, as a semiconductor light-emitting element, an LED (product name: EZR; produced by Cree Inc.) having a light emission peak wavelength shown in Table 3. The respective proportions of the resin, the orange fluorescent substance, and the green fluorescent substance were adjusted as appropriate so that each light-emitting device had a color temperature in the vicinity of 5,000 K.

FIGS. 12 through 19 illustrate emission spectra of the respective semiconductor light-emitting devices of Examples 1 through 8. The emission spectra illustrated in FIGS. 12 through 19 were the results of measurements involving use of MCPD-7000 (produced by Otsuka Electronics Ltd.).

Comparative Examples 1 and 2

The fluorescent substances shown in Table 3 were mixed with a silicone resin (product name: KER2500; produced by Shinetsu Silicone) to be dispersed therein at the mass ratios shown in Table 3 to prepare mold resins. Semiconductor light-emitting devices of the respective Comparative Examples 1 and 2 were thus prepared to each have the structure illustrated in FIG. 1.

The semiconductor light-emitting devices each included, as a semiconductor light-emitting element, an LED (product name: EZR; produced by Cree Inc.) having a light emission peak wavelength shown in Table 3. The respective proportions of the resin, the orange fluorescent substance, and the green fluorescent substance were adjusted as appropriate so that each light-emitting device had a color temperature in the vicinity of 5,000 K.

Figure 20:
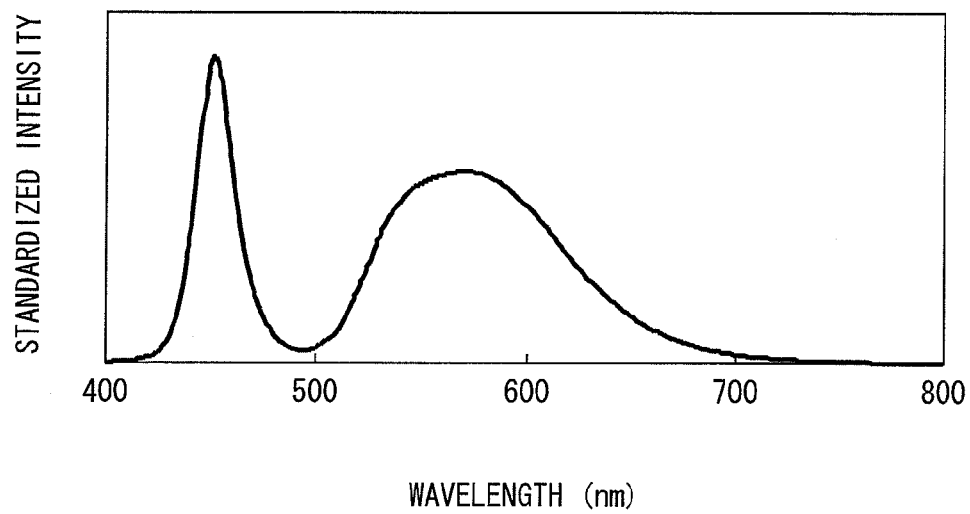
FIG. 20 is a graph illustrating an emission spectrum of a light-emitting device prepared in Comparative Example 1.
Figure 21:
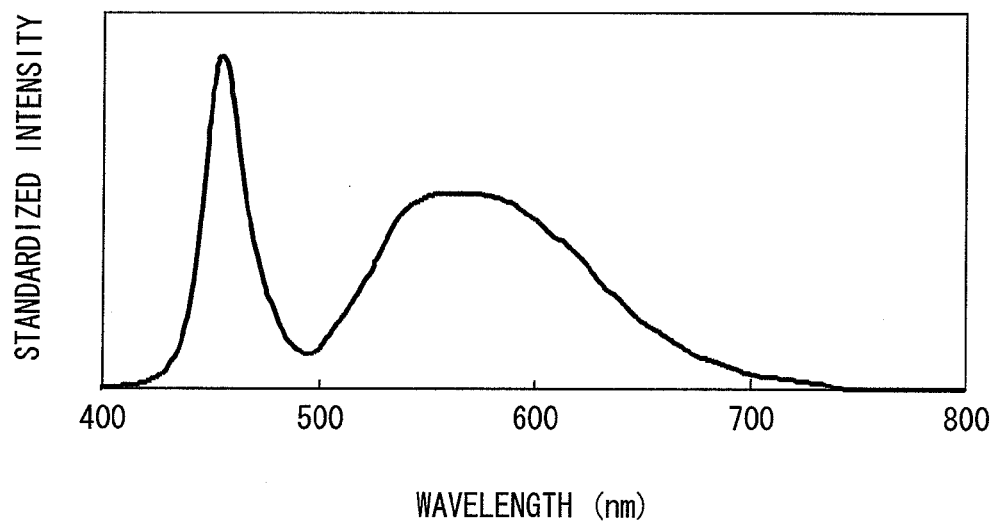
FIG. 21 is a graph illustrating an emission spectrum of a light-emitting device prepared in Comparative Example 2.

FIGS. 20 and 21 illustrate emission spectra of the respective semiconductor light-emitting devices of Comparative Examples 1 and 2. The emission spectra illustrated in FIGS. 20 and 21 were the results of measurements involving use of MCPD-7000 (produced by Otsuka Electronics Ltd.).

Comparative Example 3

The fluorescent substance of Production Example 1-1, the fluorescent substance of Production Example 2, and the fluorescent substance of Comparative Production Example 3 were mixed with a silicone resin (product name: KER2500; produced by Shinetsu Silicone) to be dispersed therein at the mass ratio of (silicone resin):(fluorescent substance of Production Example 1-1):(fluorescent substance of Production Example 2):(fluorescent substance of Comparative Production Example 3)=1:0.117:0.1:0.041 to prepare a mold resin. A semiconductor light-emitting device of Comparative Example 3 was thus prepared to have the structure illustrated in FIG. 1.

The semiconductor light-emitting device included, as a semiconductor light-emitting element, an LED (product name: EZR; produced by Cree Inc.) having a light emission peak wavelength at a wavelength of 450 nm. The respective proportions of the resin, the orange fluorescent substance, the green fluorescent substance, and the red fluorescent substance were adjusted as appropriate so that the light-emitting device had a color temperature in the vicinity of 5,000 K.

Figure 29:
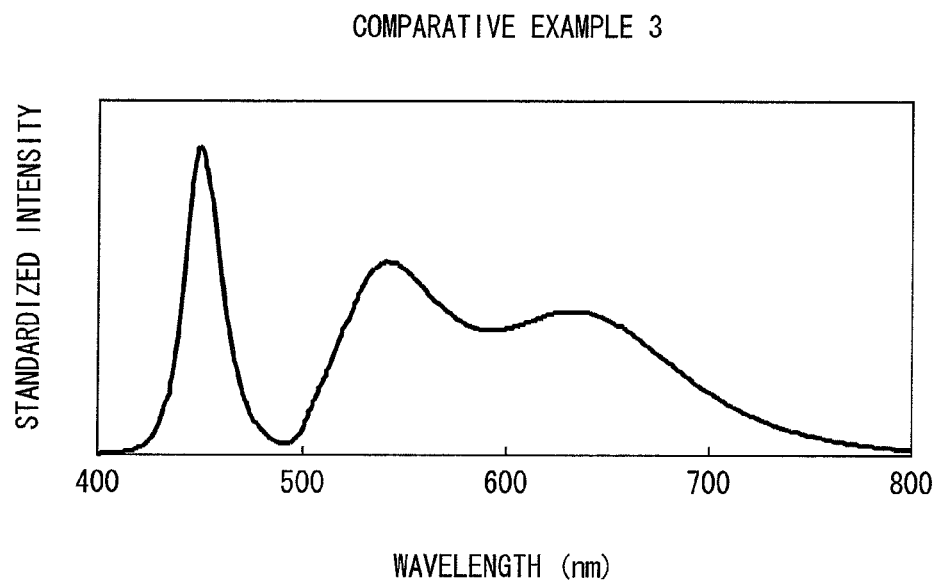
FIG. 29 is a graph illustrating an emission spectrum of a light-emitting device prepared in Comparative Example 3.

FIG. 29 illustrates an emission spectrum of the semiconductor light-emitting device of Comparative Example 3. The emission spectrum illustrated in FIG. 29 was the results of a measurement involving use of MCPD-7000 (produced by Otsuka Electronics Ltd.).

Table 4 shows fluorescence peak wavelengths, PI(90)/PI(MAX), and PI(−35)/PI(MAX) of fluorescence emission spectra of the respective semiconductor light-emitting elements prepared in Examples and Comparative Examples above. Table 5 shows light emission properties of the respective light-emitting devices prepared in Examples and Comparative Examples above.

TABLE 4

| | Fluorescence peak wavelength (nm) | PI(90)/PI(MAX) | PI(−35)/PI(MAX) |
|---|---|---|---|
| Example 1 | 546 | 0.574 | 0.421 |
| Example 2 | 546 | 0.594 | 0.419 |
| Example 3 | 546 | 0.621 | 0.417 |
| Example 4 | 546 | 0.656 | 0.417 |
| Example 5 | 548 | 0.572 | 0.461 |
| Example 6 | 548 | 0.594 | 0.457 |
| Example 7 | 551 | 0.604 | 0.523 |
| Example 8 | 554 | 0.626 | 0.756 |

TABLE 4-continued

| | Fluorescence peak wavelength (nm) | PI(90)/PI(MAX) | PI(−35)/PI(MAX) |
|---|---|---|---|
| Comparative Example 1 | 571 | 0.159 | 0.823 |
| Comparative Example 2 | 560 | 0.325 | 0.683 |
| Comparative Example 3 | 540 | 0.744 | 0.322 |

TABLE 5

| | Ra | R9 | TCP | Duv | u' | v' | Relative luminous efficiency of LED |
|---|---|---|---|---|---|---|---|
| Example 1 | 71.1 | 10.9 | 5073.0 | −1.25 | 0.212 | 0.482 | 100.0% |
| Example 2 | 74.6 | 16.9 | 5081.2 | −1.41 | 0.212 | 0.482 | 99.2% |
| Example 3 | 78.2 | 23.8 | 5071.4 | −1.34 | 0.212 | 0.482 | 96.1% |
| Example 4 | 81.4 | 32.3 | 5067.4 | −1.13 | 0.212 | 0.482 | 90.4% |
| Example 5 | 73.5 | 9.9 | 5028.2 | −1.25 | 0.212 | 0.483 | 100.4% |
| Example 6 | 76.8 | 15.7 | 5010.3 | −0.81 | 0.212 | 0.484 | 98.0% |
| Example 7 | 80.2 | 25.0 | 5036.5 | −0.98 | 0.212 | 0.483 | 91.1% |
| Example 8 | 80.4 | 28.9 | 5049.2 | −1.25 | 0.212 | 0.483 | 76.5% |
| Comparative Example 1 | 59.5 | −80.6 | 4999.1 | −0.13 | 0.212 | 0.485 | 70.2% |
| Comparative Example 2 | 69.5 | −35.3 | 5096.9 | −1.80 | 0.216 | 0.479 | 84.2% |
| Comparative Example 3 | 79.9 | 81.0 | 5010.3 | −1.02 | 0.212 | 0.483 | 65.4% |

Tables 4 and 5 show indexes that were calculated on the basis of emission spectra measured with use of spectro photometer MCPD-7000 (produced by Otsuka Electronics Ltd.). The luminous intensities of the respective semiconductor light-emitting devices were measured with use of a measurement system combining MCPD-7000 (produced by Otsuka Electronics Ltd.) with an integrating sphere.

As shown in Table 4, the semiconductor light-emitting devices of the respective Examples 1 through 8 each satisfy the requirements of the present invention for a fluorescence spectrum, that is, (i) the fluorescence spectrum having a peak wavelength within the range of 540 nm to 565 nm and (ii) 0.70>PI(90)/PI(MAX)>0.55. The semiconductor light-emitting devices of the respective Examples 1 through 7 each further satisfy PI(−35)/PI(MAX)<0.60.

The following compares the light emission properties of the light-emitting devices of the respective Examples with those of the light-emitting devices of the respective Comparative Examples with reference to Table 5.

Table 5 shows that the light-emitting devices of the respective Examples are higher in values of both Ra and R9 than the light-emitting devices of the respective Comparative Examples 1 and 2. This indicates that the light-emitting devices of the respective Examples are suitable for use in a general illumination instrument such as a household illumination instrument. This is because the light-emitting devices prepared in the respective Examples each have a fluorescence spectrum that satisfies the requirements of the present invention, particularly PI(90)/PI(MAX)>0.55, hence an improved indicator for a red component.

The light-emitting device of Comparative Example 3 is, although exhibiting higher Ra and R9 values than the light-emitting devices of the respective Examples, significantly low in luminous efficiency because it fails to satisfy 0.70>PI(90)/PI(MAX).

Figure 22:
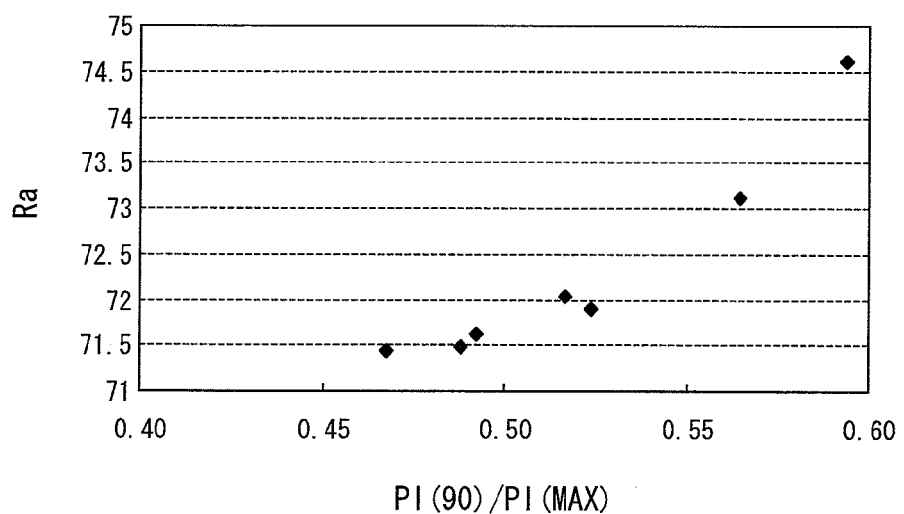
FIG. 22 is a graph illustrating a relation between Ra and PI(90)/PI(MAX) of a semiconductor light-emitting device.
Figure 23:
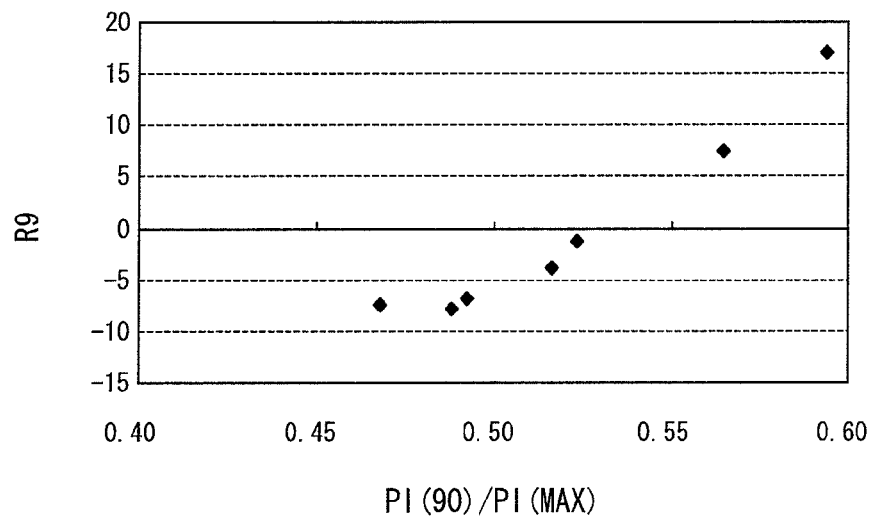
FIG. 23 is a graph illustrating a relation between R9 and PI(90)/PI(MAX) of a semiconductor light-emitting device.

The following describes the above effects with reference to FIGS. 22 and 23.

FIGS. 22 and 23 are each a graph illustrating how Ra and R9 vary according to the value of PI(90)/PI(MAX) for an LED device that (i) includes: the fluorescent substance of Production Example 2-1 as a green fluorescent substance; the fluorescent substance of Production Example 1-1, 1-2, or a similar composition as an orange fluorescent substance; and an LED having a peak wavelength of 450 nm, and thus (ii) emits white light as in Examples above.

FIG. 22 shows that Ra increases rapidly as PI(90)/PI(MAX) exceeds approximately 0.55. Further, FIG. 23 shows that R9 changes from a negative value to a positive value in the vicinity of PI(90)/PI(MAX)=0.55. In terms of industrial applicability, Ra is preferably sufficiently higher than 70, and R9 preferably has a positive value.

Comparison of the luminous efficiency (luminous intensity) between the light-emitting devices of the respective Examples and those of the respective Comparative Examples shows that the light-emitting devices of the respective Examples are higher in luminous efficiency except for that of Example 8. Typically, in the case where a green fluorescent substance is combined with a fluorescent substance of another color to constitute a light-emitting device, the light-emitting device tends to have a luminous efficiency that is determined by the luminous efficiency of the green fluorescent substance, which has a peak wavelength within a wavelength region within which (i) the spectral luminous efficacy for humans is high and (ii) light has a brightness that is sensitive to humans.

The light-emitting devices of the respective Examples 1 through 7 and those of the respective Comparative Examples 1 and 2 share the identical green fluorescent substance of Production Example 1-1. Nevertheless, the light-emitting devices of the respective Examples 1 through 7 are higher in luminous efficiency. This is because the light-emitting devices of the respective Examples 1 through 7 each have an emission spectrum that has a peak wavelength of not less than 540 nm and less than 560 nm.

The light-emitting devices of the respective Examples 1 through 7 and those of the respective Comparative Examples 1 and 2 share the identical green fluorescent substance of Production Example 2-1. Nevertheless, the light-emitting devices of the respective Examples 1 through 7 are higher in luminous efficiency. This is because the light-emitting devices of the respective Examples 1 through 7 each satisfy PI(−35)/PI(MAX)<0.60 and thus have an emission spectrum that has a sharp peak in correspondence with a higher part of the spectral luminous efficacy.

The light-emitting devices of the respective Examples 1 through 8 are particularly higher in luminous efficiency than that of Comparative Example 1. This is because the light-emitting devices of the respective Examples 1 through 8 each include an orange fluorescent substance that satisfies ABS(520)/ABS(MAX)<0.60 and thus sufficiently reduces absorption of green light emitted by the green fluorescent substance.

Figure 24:
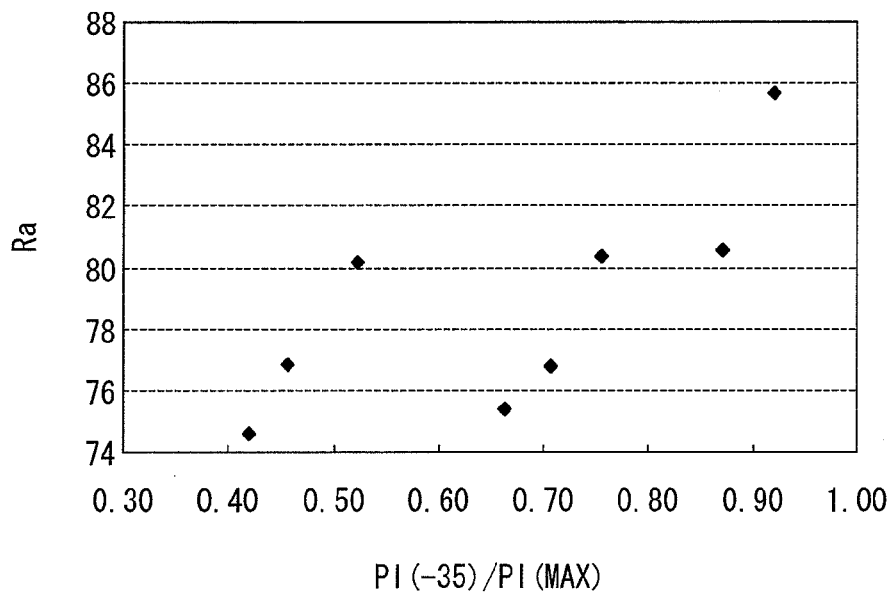
FIG. 24 is a graph illustrating a relation between Ra and PI(−35)/PI(MAX) of a semiconductor light-emitting device.

The following describes the above effects with reference to FIGS. 24 and 25.

FIGS. 24 and 25 are each a graph illustrating how Ra and a relative emission intensity of an LED vary according to the value of PI(−35)/PI(MAX).

Specifically, FIGS. 24 and 25 are each a graph illustrating how Ra and a relative emission intensity of an LED device vary according to the value of PI(−35)/PI(MAX), the LED emitting white light as in Examples above and being constituted by including: the fluorescent substance of Production Example 1-1 as an orange fluorescent substance; as a green fluorescent substance, a combination of the fluorescent substance of Production Example 2-1 and a fluorescent substance that had (i) a luminous efficiency equivalent to that of the fluorescent substance of Production Example 2-1 and (ii) an emission spectrum different from that of the fluorescent substance of Production Example 2-1; and an LED having a peak wavelength of 450 nm.

As illustrated in FIG. 24, Ra substantially levels off in the region where PI(−35)/PI(MAX) is not more than 0.8, whereas the LED emission intensity rapidly drops in the region of PI(−35)/PI(MAX)>0.60. This is because as PI(−35)/PI(MAX) increases, the emission intensity corresponding to a higher part of the spectral luminous efficacy for humans relatively decreases.

Further, PI(−35)/PI(MAX) being high indicates either a large half width of the emission spectrum of the green fluorescent substance or the green fluorescent substance having a peak wavelength to a shorter wavelength side. In the case where the green fluorescent substance has an emission spectrum that has (i) a large half width and (ii) a peak wavelength to a short wavelength side, the orange fluorescent substance absorbs a larger amount of green light, which in turn further decreases the luminous efficiency. This is described below with reference to FIG. 26.

FIG. 26 is a graph in which are plotted (i) an absorption spectrum of the orange fluorescent substance of Production Example 1-1 and (ii) emission spectra of the green fluorescent substances of the respective Production Examples 2-1 and 2-2.

As described above, the green fluorescent substance of Production Example 2-1 has an emission spectrum that has a half width of 53 nm and a peak wavelength of 540 nm, whereas the green fluorescent substance of Production Example 2-2 has an emission spectrum that has a half width of 69 nm and a peak wavelength of 528 nm. Thus, the emission spectrum of the green fluorescent substance of Production Example 2-2 has a larger half width and a peak wavelength further to the short wavelength side than the emission spectrum of the green fluorescent substance of Production Example 2-1. FIG. 26 shows that the emission spectrum of the green fluorescent substance of Production Example 2-2 overlaps the absorption spectrum of the orange fluorescent substance by a larger area than does the emission spectrum of the green fluorescent substance of Production Example 2-1.

The light-emitting devices of the respective Examples each (i) include a green fluorescent substance having an absorptance of not more than 10% with respect to light having a wavelength of 600 nm, and thus (ii) have a particularly high luminous efficiency. This is described below with reference to FIG. 27.

FIG. 27 is a graph illustrating how a relative emission intensity of an LED varies according to the value of an absorptance of a green fluorescent substance with respect to light having a wavelength of 600 nm. More specifically, FIG. 27 is a graph illustrating how a relative emission intensity of an LED varies according to the value of an absorptance of a green fluorescent substance with respect to light having a wavelength of 600 nm, the LED emitting white light as in Examples above and being constituted by including: the fluorescent substance of Production Example 1-1 as an orange fluorescent substance; as a green fluorescent substance, a combination of the fluorescent substance of Production Example 2-1 and a fluorescent substance prepared by a production process changed from that of Production Example 2 to change the absorptance with respect to light having a wavelength of 600 nm; and an LED having a peak wavelength of 450 nm.

FIG. 27 shows that the relative emission intensity of the LED dramatically increases in the region where the absorptance of the green fluorescent substance with respect to light having a wavelength of 600 nm is not more than 10%. This is because the absorptance of the green fluorescent substance with respect to light having a wavelength of 600 nm being not more than 10% made it possible to (i) sufficiently reduce unnecessary absorption by the green fluorescent substance to improve the luminous efficiency of the green fluorescent substance and (ii) sufficiently reduce unnecessary absorption of orange light in the vicinity of the peak wavelength of the orange fluorescent substance.

Further, comparison between Examples 1 through 4 and Examples 5 through 7 indicates that a longer wavelength of the LED allows for a higher color rendering property with respect to identical fluorescent substances in use. This is because a longer wavelength of the LED (i) results in a more continuous emission spectrum of the light-emitting device over a range from the blue range to the green range and (ii) changes the emission spectrum of the orange fluorescent substance.

FIG. 37 compares emission spectra of the orange fluorescent substance of Production Example 1-1, the emission spectra having been achieved by exciting the orange fluorescent substance by respective light beams of wavelengths of 440 nm, 450 nm, and 460 nm. FIG. 37 indicates that the orange fluorescent substance of the present invention has an emission spectrum that tends to be shifted to the longer wavelength side in response to a longer excitation wavelength. In the case where the orange fluorescent substance has an emission spectrum that both (i) satisfies the range requirements of the present invention and that (ii) is shifted to the longer wavelength side, the light-emitting device tends to have a higher color rendering property. Thus, as described above, the light-emitting device of the present invention, in the case where the wavelength of its LED is changed from 450 nm to a longer wavelength of 460 nm, has a higher color rendering property.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

The semiconductor light-emitting element of the present invention is high in luminous efficiency and emits white light exhibiting high Ra and R9 values. The semiconductor light-emitting element can thus be suitably used for various illumination instruments such as a household illumination instrument and a vehicle lighting fixture.

The invention claimed is:

1. A semiconductor light-emitting device comprising:
   a semiconductor light-emitting element that emits blue light;
   a green fluorescent substance that absorbs the blue light and emits green light; and
   an orange fluorescent substance that absorbs the blue light and emits orange light
   combination light, which is obtained by combining the green light and the orange light, being emitted out of the semiconductor light-emitting device,
   the combination light having a fluorescence spectrum that (i) has a peak wavelength of not less than 540 nm and not more than 565 nm and that (ii) satisfies a relation of $0.70 > PI(90)/PI(MAX) > 0.55$, where PI(MAX) represents an emission intensity at the peak wavelength, and PI(90) represents an emission intensity at a wavelength 90 nm longer than the peak wavelength,
   the fluorescence spectrum of the combination light further satisfying a relation of $PI(-35)/PI(MAX) < 0.60$, where PI(−35) represents an emission intensity at a wavelength 35 nm shorter than the peak wavelength,
   the orange fluorescent substance being a Ce-activated fluorescent substance,
   the Ce-activated fluorescent substance being a solid solution crystal that contains Ce and oxygen each in a form of a solid solution in a crystal having a composition of

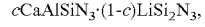
   $cCaAlSiN_3 \cdot (1-c)LiSi_2N_3$, where $0.2 \leq c \leq 0.8$,
   the solid solution crystal containing Ce and oxygen each in the form of a solid solution having a Ce concentration of not more than 6 weight %, and
   the solid solution crystal containing Ce and oxygen each in the form of a solid solution having a Li concentration of not less than 1.5 weight % and not more than 4 weight %.

2. The semiconductor light-emitting device according to claim 1, wherein:
   the blue light emitted by the semiconductor light-emitting element has a peak wavelength of not less than 440 nm and not more than 470 nm;
   fluorescence emitted by the orange fluorescent substance has an emission spectrum that has a peak wavelength of not less than 570 nm and not more than 620 nm; and
   the emission spectrum of the fluorescence emitted by the orange fluorescent substance has a half width of not less than 120 nm and not more than 150 nm.

3. The semiconductor light-emitting device according to claim 1, wherein:
   the orange fluorescent substance satisfies a relation of $ABS(520)/ABS(MAX) < 0.60$, where ABS(MAX) represents a maximum value of an absorptance of the orange fluorescent substance within a range of a wavelength longer than 420 nm, and ABS(520) represents a value of the absorptance of the orange fluorescent substance at a wavelength of 520 nm.

4. The semiconductor light-emitting device according to claim 1, wherein:
   the Ce-activated fluorescent substance is one of a Ce-activated nitride fluorescent substance and a Ce-activated oxynitride fluorescent substance.

5. The semiconductor light-emitting device according to claim 1, wherein:
   the orange fluorescent substance has an excitation spectrum that has an excitation peak at a wavelength of not less than 440 nm and not more than 470 nm; and
   the orange fluorescent substance has a fluorescence spectrum that has a light emission peak at a wavelength of not less than 580 nm and not more than 620 nm.

6. The semiconductor light-emitting device according to claim 1, wherein:
   fluorescence emitted by the green fluorescent substance has an emission spectrum that has a peak wavelength of not less than 520 nm and not more than 545 nm.

7. The semiconductor light-emitting device according to claim 1, wherein:
   fluorescence emitted by the green fluorescent substance has an emission spectrum that has a half width of not more than 55 nm.

8. The semiconductor light-emitting device according to claim 1, wherein:
    the green fluorescent substance is a Eu-activated β-sialon fluorescent substance.

9. The semiconductor light-emitting device according to claim 8, wherein:
    the Eu-activated β-sialon fluorescent substance has an absorptance of not more than 10% with respect to light having a wavelength of 600 nm.

10. The semiconductor light-emitting device as set forth in claim 1, wherein the solid solution crystal has a Ce concentration of not less than 1.07 weight %.

* * * * *